(12) United States Patent
Pehlke

(10) Patent No.: US 11,515,608 B2
(45) Date of Patent: Nov. 29, 2022

(54) REMOTE COMPENSATORS FOR MOBILE DEVICES

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 53 days.

(21) Appl. No.: 16/802,323

(22) Filed: Feb. 26, 2020

(65) Prior Publication Data

US 2020/0274219 A1    Aug. 27, 2020

Related U.S. Application Data

(60) Provisional application No. 62/811,199, filed on Feb. 27, 2019, provisional application No. 62/962,409, filed on Jan. 17, 2020.

(51) Int. Cl.
| | |
|---|---|
| *H01P 1/397* | (2006.01) |
| *H03F 3/195* | (2006.01) |
| *H01Q 21/30* | (2006.01) |
| *H04B 7/0426* | (2017.01) |

(52) U.S. Cl.
CPC ............. *H01P 1/397* (2013.01); *H01Q 21/30* (2013.01); *H03F 3/195* (2013.01); *H04B 7/0426* (2013.01)

(58) Field of Classification Search
CPC .... H01P 1/397; H03F 3/195; H03F 2200/451; H03F 3/245; H01Q 21/30; H04B 7/0426
See application file for complete search history.

(56) References Cited

U.S. PATENT DOCUMENTS

| | | | |
|---|---|---|---|
| 4,367,443 A | * | 1/1983 | Hull .......................... H03F 3/60 330/149 |
| 5,880,921 A | | 3/1999 | Tham et al. |
| 5,959,516 A | | 9/1999 | Chang et al. |
| 5,994,985 A | | 11/1999 | Pehlke et al. |
| 6,232,847 B1 | | 5/2001 | Marcy et al. |
| 9,397,721 B2 | | 7/2016 | Pehlke |
| 9,496,913 B2 | | 11/2016 | King et al. |
| 9,572,052 B2 | | 2/2017 | King et al. |
| 9,621,327 B2 | | 4/2017 | Chang et al. |
| 9,748,992 B2 | | 8/2017 | Pehlke |
| 9,768,941 B2 | | 9/2017 | Pehlke |
| 9,838,058 B2 | | 12/2017 | Pehlke et al. |
| 9,859,850 B2 | | 1/2018 | Pehlke |

(Continued)

*Primary Examiner* — Lester G Kincaid
*Assistant Examiner* — Maryam Soltanzadeh
(74) *Attorney, Agent, or Firm* — Knobbe, Martens, Olson & Bear, LLP

(57) ABSTRACT

Remote compensators for mobile devices are provided. In certain embodiments, a mobile device includes a cable-side circulator, an antenna, receive amplifier circuitry that amplifies a receive signal from the antenna and provides an amplified receive signal to the cable-side circulator, transmit amplifier circuitry that amplifies a transmit signal from the cable-side circulator, and a first antenna-side circulator and a second antenna-side circulator each coupled between the transmit amplifier circuitry and the antenna. The first antenna-side circulator and the second antenna-side circulator operate to compensate the receive signal for transmit leakage arising from the transmit amplifier circuitry.

20 Claims, 15 Drawing Sheets

(56) References Cited

U.S. PATENT DOCUMENTS

| | | | |
|---|---|---|---|
| 9,866,268 B2 | 1/2018 | King et al. | |
| 9,866,366 B2 | 1/2018 | Pehlke | |
| 9,991,918 B2 | 6/2018 | King et al. | |
| 10,014,889 B2 | 7/2018 | King et al. | |
| 10,050,529 B2 | 8/2018 | Pehlke et al. | |
| 10,069,615 B2 | 9/2018 | Chang et al. | |
| 10,075,199 B2 | 9/2018 | King et al. | |
| 10,103,772 B2 | 10/2018 | Pehlke et al. | |
| 10,135,469 B2 | 11/2018 | Chang et al. | |
| 2010/0149066 A1* | 6/2010 | Narhi | H04B 1/745 343/874 |
| 2010/0156537 A1* | 6/2010 | Dishop | H03F 3/24 330/276 |
| 2014/0130108 A1* | 5/2014 | Oh | H04N 21/41 725/85 |
| 2016/0006556 A1 | 1/2016 | Pehlke et al. | |
| 2016/0127016 A1 | 5/2016 | Pehlke et al. | |
| 2016/0241026 A1 | 8/2016 | Pehlke | |
| 2016/0242057 A1 | 8/2016 | Ripley et al. | |
| 2016/0365908 A1 | 12/2016 | Chang et al. | |
| 2017/0048028 A1 | 2/2017 | Pehlke et al. | |
| 2017/0195106 A1 | 7/2017 | Pehlke | |
| 2017/0222687 A1* | 8/2017 | Wyville | H04B 1/525 |
| 2017/0373730 A1 | 12/2017 | Pehlke et al. | |
| 2018/0076774 A1 | 3/2018 | Pehlke et al. | |
| 2018/0131500 A1 | 5/2018 | Pehlke | |
| 2018/0159577 A1 | 6/2018 | Pehlke et al. | |
| 2018/0205530 A1 | 7/2018 | Pehlke | |
| 2018/0212644 A1* | 7/2018 | Nakajima | H04B 1/525 |
| 2018/0294858 A1 | 10/2018 | Pehlke | |
| 2018/0323947 A1 | 11/2018 | Brunel et al. | |
| 2018/0367173 A1 | 12/2018 | King et al. | |
| 2019/0007073 A1 | 1/2019 | King et al. | |
| 2019/0013836 A1 | 1/2019 | Pehlke et al. | |
| 2019/0097661 A1 | 3/2019 | Chang et al. | |
| 2019/0115946 A1 | 4/2019 | Pehlke | |
| 2019/0123699 A1 | 4/2019 | Andrys et al. | |
| 2019/0123769 A1 | 4/2019 | Pehlke et al. | |
| 2019/0123770 A1 | 4/2019 | Pehlke | |
| 2019/0149178 A1 | 5/2019 | King et al. | |
| 2019/0158137 A1 | 5/2019 | Brunel et al. | |
| 2019/0245439 A1 | 8/2019 | Pehlke et al. | |
| 2019/0305804 A1 | 10/2019 | Pehlke et al. | |
| 2020/0036406 A1 | 1/2020 | Pehlke et al. | |
| 2020/0099502 A1 | 3/2020 | Brunel et al. | |
| 2020/0106463 A1 | 4/2020 | Chang et al. | |
| 2020/0106497 A1 | 4/2020 | Pehlke | |
| 2020/0112348 A1 | 4/2020 | Pehlke et al. | |
| 2020/0162029 A1 | 5/2020 | Pehlke et al. | |
| 2020/0162114 A1 | 5/2020 | King et al. | |
| 2020/0162209 A1 | 5/2020 | Pehlke et al. | |
| 2020/0228159 A1 | 7/2020 | Raghavan et al. | |
| 2020/0274219 A1 | 8/2020 | Pehlke | |
| 2020/0336110 A1 | 10/2020 | Drogi et al. | |
| 2020/0350866 A1 | 11/2020 | Pehlke | |
| 2020/0350878 A1 | 11/2020 | Drogi et al. | |

\* cited by examiner

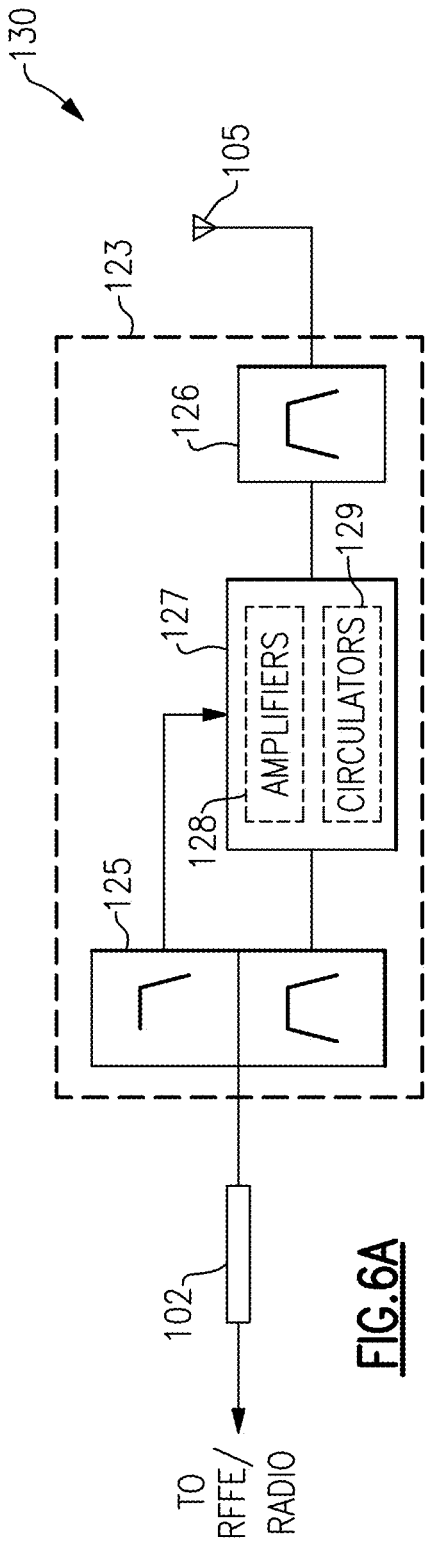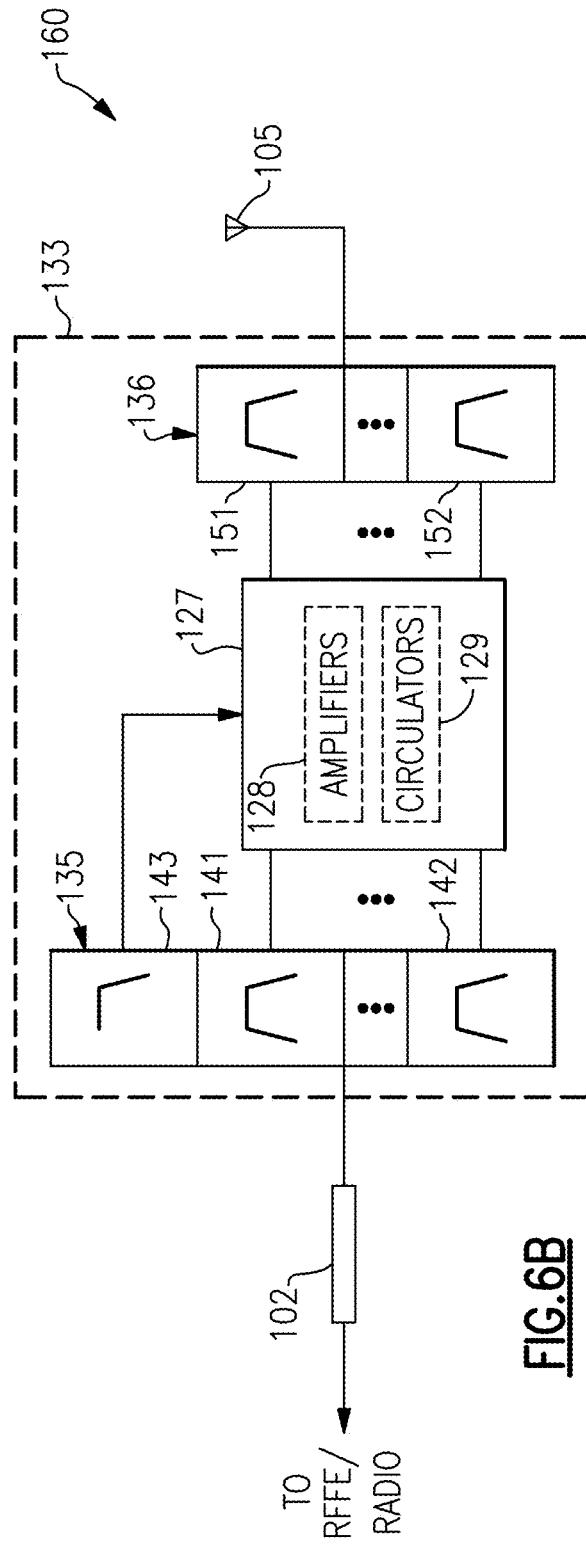

REMOTE COMPENSATORS FOR MOBILE DEVICES

CROSS-REFERENCE TO RELATED APPLICATIONS

This application claims the benefit of priority under 35 U.S.C. § 119 of U.S. Provisional Patent Application No. 62/962,409, filed Jan. 17, 2020 and titled "REMOTE COMPENSATORS FOR COMMUNICATION SYSTEMS," and of U.S. Provisional Patent Application No. 62/811,199, filed Feb. 27, 2019 and titled "REMOTE COMPENSATORS FOR COMMUNICATION SYSTEMS," each of which is herein incorporated by reference in its entirety.

BACKGROUND

Technical Field

Embodiments of the invention relate to electronic systems, and in particular, to radio frequency (RF) electronics.

Description of the Related Technology

Radio frequency (RF) communication systems are used to wirelessly transmit and receive RF signals. Examples of RF communication systems include, but are not limited to, mobile phones, tablets, base stations, network access points, customer-premises equipment (CPE), laptops, and wearable electronics.

Such RF communication systems can transmit and receive RF signals using a cellular standard, a wireless local area network (WLAN) standard, and/or any other suitable communication standard. An RF signal can have a frequency in the range of about 30 kHz to 300 GHz, such as in the range of about 410 MHz to about 7.125 GHz for fifth generation (5G) Frequency Range 1 (FR1) communications.

SUMMARY

In certain embodiments, the present disclosure relates to a wireless device. The wireless device includes a cable, an antenna, and a remote compensator electrically connected between the cable and the antenna. The remote compensator includes a cable-side multiplexer coupled to the cable, an antenna-side multiplexer coupled to the antenna, at least one cable-side circulator, at least one antenna-side circulator, at least one transmit amplifier configured to provide one or more amplified transmit signals to the antenna by way of the at least one antenna-side circulator and the antenna-side multiplexer, and at least one receive amplifier configured to provide one or more amplified receive signals to the cable by way of the at least one cable-side circulator and the cable-side multiplexer.

In some embodiments, the cable-side multiplexer is configured to extract a DC supply voltage from the cable, and to power the at least one transmit amplifier and the at least one receive amplifier with the DC supply voltage.

In various embodiments, the at least one transmit amplifier is configured to receive one or more transmit signals for amplification by way of the at least one cable-side circulator and the cable-side multiplexer.

In several embodiments, the at least one receive amplifier is configured to receive one or more receive signals for amplification by way of the at least one antenna-side circulator and the antenna-side multiplexer.

In some embodiments, the antenna-side multiplexer is configured to extract a DC antenna voltage from the antenna. According to a number of embodiments, the wireless device further includes a circuit configured to process the DC antenna voltage to detect at least one of an open circuit, a short circuit, or damage to the antenna.

In various embodiments, the at least one cable-side circulator includes a first cable-side circulator and a second cable-side circulator, the at least one antenna-side circulator includes a first antenna-side circulator and a second antenna-side circulator, the at least one transmit amplifier includes a first transmit amplifier and a second transmit amplifier, and the at least one receive amplifier includes a first receive amplifier and a second receive amplifier.

In accordance with a number of embodiments, the first transmit amplifier is configured to amplify a first transmit signal received from the cable by way of the first cable-side circulator and a first bandpass section of the cable-side multiplexer, and the second transmit amplifier is configured to amplify a second transmit signal received from the cable by way of the second cable-side circulator and a second bandpass section of the cable-side multiplexer.

According to several embodiments, the first transmit amplifier is configured to provide a first amplified transmit signal of the two or more amplified transmit signals to the antenna by way of the first antenna-side circulator and a first bandpass section of the antenna-side multiplexer, and the second transmit amplifier is configured to provide a second amplified transmit signal of the two or more amplified transmit signals to the antenna by way of the second antenna-side circulator and a second bandpass section of the antenna-side multiplexer.

In accordance with some embodiments, the first receive amplifier is configured to amplify a first receive signal received from the antenna by way of the first antenna-side circulator and a first bandpass section of the antenna-side multiplexer, and the second receive amplifier is configured to amplify a second receive signal received from the antenna by way of the second antenna-side circulator and a second bandpass section of the antenna-side multiplexer. According to a number of embodiments, the first receive amplifier is configured to provide a first amplified receive signal of the two or more amplified receive signals to the cable by way of the first cable-side circulator and a first bandpass section of the cable-side multiplexer, and the second receive amplifier is configured to provide a second amplified receive signal of the two or more amplified receive signals to the cable by way of the second cable-side circulator and a second bandpass section of the cable-side multiplexer.

In various embodiments, the at least one transmit amplifier includes one or more power amplifiers.

In several embodiments, the at least one receive amplifier includes one or more low noise amplifiers.

In certain embodiments, the present disclosure relates to a remote compensator for a wireless device. The remote compensator includes a cable-side multiplexer coupled to a cable port, an antenna-side multiplexer coupled to an antenna port, at least one cable-side circulator coupled to the cable-side multiplexer, at least one antenna-side circulator coupled to the antenna-side multiplexer, at least one transmit amplifier configured to provide one or more amplified transmit signals to the antenna port by way of the at least one antenna-side circulator and the antenna-side multiplexer, and at least one receive amplifier configured to provide one or more amplified receive signals to the cable port by way of the at least one cable-side circulator and the cable-side multiplexer.

In various embodiments, the cable-side multiplexer is configured to extract a DC supply voltage from the cable port, and to power the at least one transmit amplifier and the at least one receive amplifier with the DC supply voltage.

In some embodiments, the at least one transmit amplifier is configured to receive one or more transmit signals for amplification by way of the at least one cable-side circulator and the cable-side multiplexer.

In several embodiments, the at least one receive amplifier is configured to receive one or more receive signals for amplification by way of the at least one antenna-side circulator and the antenna-side multiplexer.

In various embodiments, the antenna-side multiplexer is configured to extract a DC antenna voltage from the antenna port. According to a number of embodiments, the remote compensator further includes a circuit configured to process the DC antenna voltage to detect at least one of an open circuit, a short circuit, or damage to an antenna coupled to the antenna port.

In some embodiments, the at least one cable-side circulator includes a first cable-side circulator and a second cable-side circulator, the at least one antenna-side circulator includes a first antenna-side circulator and a second antenna-side circulator, the at least one transmit amplifier includes a first transmit amplifier and a second transmit amplifier, and the at least one receive amplifier includes a first receive amplifier and a second receive amplifier.

According to a number of embodiments, the first transmit amplifier is configured to amplify a first transmit signal received from the cable port by way of the first cable-side circulator and a first bandpass section of the cable-side multiplexer, and the second transmit amplifier is configured to amplify a second transmit signal received from the cable port by way of the second cable-side circulator and a second bandpass section of the cable-side multiplexer. In accordance with several embodiments, the first transmit amplifier is configured to provide a first amplified transmit signal of the two or more amplified transmit signals to the antenna port by way of the first antenna-side circulator and a first bandpass section of the antenna-side multiplexer, and the second transmit amplifier is configured to provide a second amplified transmit signal of the two or more amplified transmit signals to the antenna port by way of the second antenna-side circulator and a second bandpass section of the antenna-side multiplexer.

According to various embodiments, the first receive amplifier is configured to amplify a first receive signal received from the antenna port by way of the first antenna-side circulator and a first bandpass section of the antenna-side multiplexer, and the second receive amplifier is configured to amplify a second receive signal received from the antenna port by way of the second antenna-side circulator and a second bandpass section of the antenna-side multiplexer. In accordance with a number of embodiments, the first receive amplifier is configured to provide a first amplified receive signal of the two or more amplified receive signals to the cable port by way of the first cable-side circulator and a first bandpass section of the cable-side multiplexer, and the second receive amplifier is configured to provide a second amplified receive signal of the two or more amplified receive signals to the cable port by way of the second cable-side circulator and a second bandpass section of the cable-side multiplexer.

In some embodiments, the at least one transmit amplifier includes one or more power amplifiers.

In various embodiments, the at least one receive amplifier includes one or more low noise amplifiers.

In certain embodiments, the present disclosure relates to a packaged module. The packaged module includes a packaged substrate including a cable pad for connecting to a cable and an antenna pad for connecting to an antenna, a plurality of multiplexers on the packaged substrate including a cable-side multiplexer coupled to the cable pad and an antenna-side multiplexer coupled to the antenna pad, a plurality of circulators on the packaged substrate including at least one cable-side circulator and at least one antenna-side circulator, and a semiconductor die attached to the packaged substrate and including at least one transmit amplifier configured to provide one or more amplified transmit signals to the antenna pad by way of the at least one antenna-side circulator and the antenna-side multiplexer, and at least one receive amplifier configured to provide one or more amplified receive signals to the cable pad by way of the at least one cable-side circulator and the cable-side multiplexer.

In various embodiments, the cable-side multiplexer is configured to extract a DC supply voltage from the cable pad, and to power the semiconductor die with the DC supply voltage.

In some embodiments, the at least one transmit amplifier is configured to receive one or more transmit signals for amplification by way of the at least one cable-side circulator and the cable-side multiplexer.

In various embodiments, the at least one receive amplifier is configured to receive one or more receive signals for amplification by way of the at least one antenna-side circulator and the antenna-side multiplexer.

In some embodiments, the antenna-side multiplexer is configured to extract a DC antenna voltage from the antenna pad. According to a number of embodiments, the semiconductor die further includes a circuit configured to process the DC antenna voltage to detect at least one of an open circuit, a short circuit, or damage to an antenna coupled to the antenna pad.

In various embodiments, the at least one cable-side circulator includes a first cable-side circulator and a second cable-side circulator, the at least one antenna-side circulator includes a first antenna-side circulator and a second antenna-side circulator, the at least one transmit amplifier includes a first transmit amplifier and a second transmit amplifier, and the at least one receive amplifier includes a first receive amplifier and a second receive amplifier.

According to several embodiments, the first transmit amplifier is configured to amplify a first transmit signal received from the cable pad by way of the first cable-side circulator and a first bandpass section of the cable-side multiplexer, and the second transmit amplifier is configured to amplify a second transmit signal received from the cable pad by way of the second cable-side circulator and a second bandpass section of the cable-side multiplexer. In accordance with a number of embodiments, the first transmit amplifier is configured to provide a first amplified transmit signal of the two or more amplified transmit signals to the antenna pad by way of the first antenna-side circulator and a first bandpass section of the antenna-side multiplexer, and the second transmit amplifier is configured to provide a second amplified transmit signal of the two or more amplified transmit signals to the antenna pad by way of the second antenna-side circulator and a second bandpass section of the antenna-side multiplexer.

According to some embodiments, the first receive amplifier is configured to amplify a first receive signal received from the antenna pad by way of the first antenna-side circulator and a first bandpass section of the antenna-side multiplexer, and the second receive amplifier is configured to amplify a second receive signal received from the antenna pad by way of the second antenna-side circulator and a second bandpass section of the antenna-side multiplexer. In accordance with a number of embodiments, the first receive amplifier is configured to provide a first amplified receive signal of the two or more amplified receive signals to the cable by way of the first cable-side circulator and a first bandpass section of the cable-side multiplexer, and the second receive amplifier is configured to provide a second amplified receive signal of the two or more amplified receive signals to the cable by way of the second cable-side circulator and a second bandpass section of the cable-side multiplexer.

In several embodiments, the at least one transmit amplifier includes one or more power amplifiers.

In various embodiments, the at least one receive amplifier includes one or more low noise amplifiers.

In certain embodiments, the present disclosure relates to a method of remote compensation in a communication system. The method includes amplifying one or more transmit signals using at least one transmit amplifier to generate one or more amplified transmit signals, providing the one or more transmit signals from the at least one transmit amplifier to an antenna by way of at least one antenna-side circulator and an antenna-side multiplexer, amplifying one or more receive signals using at least one receive amplifier to generate one or more amplified receive signals, and providing the one or more receive signals from the at least one receive amplifier to a cable by way of at least one cable-side circulator and a cable-side multiplexer.

In several embodiments, the method further includes extracting a DC supply voltage from the cable using the cable-side multiplexer, and powering the at least one transmit amplifier and the at least one receive amplifier using the DC supply voltage.

In various embodiments, the method further includes receiving one or more transmit signals for amplification as inputs to the at least one transmit amplifier by way of the at least one cable-side circulator and the cable-side multiplexer.

In some embodiments, the method further includes receiving one or more receive signals for amplification as inputs to the at least one receive amplifier by way of the at least one antenna-side circulator and the antenna-side multiplexer.

In various embodiments, the method further includes extracting a DC antenna voltage from the antenna. According to several embodiments, the method further includes processing the DC antenna voltage to detect at least one of an open circuit, a short circuit, or damage to the antenna.

In some embodiments, amplifying the one or more transmit signals using the at least one transmit amplifier further includes amplifying a plurality of transmit signals of different frequency bands each using a separate transmit amplifier.

In a number of embodiments, amplifying the one or more receive signals using the at least one receive amplifier further includes amplifying a plurality of receive signals of different frequency bands each using a separate receive amplifier.

In certain embodiments, the present disclosure relates to a wireless device. The wireless device includes a cable, an antenna, and a remote compensator electrically connected between the cable and the antenna. The remote compensator includes a cable-side circulator coupled to the cable, an antenna-side circulator coupled to the antenna, a transmit bypass path configured to receive a transmit signal from the cable by way of the cable-side circulator and to provide the transmit signal to the antenna by way of the antenna-side circulator, and a receive amplifier configured to receive a receive signal from the antenna by way of the antenna-side circulator and to provide an amplified receive signal to the cable by way of the cable-side circulator.

In various embodiments, the remote compensator further includes a cable-side multiplexer connected between the cable and the cable-side circulator. According to a number of embodiments, the cable-side multiplexer is configured to extract a DC supply voltage from the cable, and to power the receive amplifier with the DC supply voltage.

In certain embodiments, the present disclosure relates to a remote compensator. The remote compensator includes a cable-side circulator coupled to a cable port, an antenna-side circulator coupled to an antenna port, a transmit bypass path configured to receive a transmit signal from the cable port by way of the cable-side circulator and to provide the transmit signal to the antenna port by way of the antenna-side circulator, and a receive amplifier configured to receive a receive signal from the antenna port by way of the antenna-side circulator and to provide an amplified receive signal to the cable port by way of the cable-side circulator.

In various embodiments, the remote compensator further includes a cable-side multiplexer connected between the cable port and the cable-side circulator. According to a number of embodiments, the cable-side multiplexer is configured to extract a DC supply voltage from the cable port, and to power the receive amplifier with the DC supply voltage.

In certain embodiments, the present disclosure relates to a packaged module. The packaged module includes a packaged substrate including a cable pad for connecting to a cable and an antenna pad for connecting to an antenna, a cable-side circulator attached to the package substrate and coupled to the cable pad, an antenna-side circulator attached to the package substrate and coupled to the antenna port, a transmit bypass path formed on the package substrate and configured to receive a transmit signal from the cable pad by way of the cable-side circulator and to provide the transmit signal to the antenna pad by way of the antenna-side circulator; and a semiconductor die attached to the package substrate and including a receive amplifier configured to receive a receive signal from the antenna pad by way of the antenna-side circulator and to provide an amplified receive signal to the cable pad by way of the cable-side circulator.

In several embodiments, the packaged module further includes a cable-side multiplexer attached to the package substrate and connected between the cable pad and the cable-side circulator. According to a number of embodiments, the cable-side multiplexer is configured to extract a DC supply voltage from the cable pad, and to power the receive amplifier with the DC supply voltage.

In certain embodiments, the present disclosure relates to a wireless device. The wireless device includes an antenna, a cable, a cable-side circulator coupled to the cable, a receive amplifier configured to amplify a receive signal from the antenna to provide an amplified receive signal to the cable by way of the cable-side circulator, and a first antenna-side circulator and a second antenna-side circulator each coupled along a transmit path from the cable to the antenna. The first antenna-side circulator and the second antenna-side circulator are configured to compensate the receive signal for transmit leakage arising from the transmit path.

In some embodiments, the wireless device further includes a transmit amplifier having an input connected to the cable-side circulator and an output connected to the second antenna-side circulator, the first antenna-side circulator connected between the second antenna-side circulator and the antenna. According to a number of embodiments, the wireless device further includes a combiner configured to generate the receive signal at an output and coupled to the first antenna-side circulator at a first input, and a phase shifter coupled between the second antenna-side circulator and a second input of the combiner.

In several embodiments, the wireless device further includes transmit amplifier circuitry configured to generate a first amplified transmit signal at a first output and a second amplified transmit signal at a second output based on amplifying and splitting a transmit signal received from the cable, the first antenna-side circulator coupled between the first output and antenna and the second antenna-side circulator coupled between the second output and the antenna. According to a number of embodiments, the wireless device further includes a first combiner for combining the first amplified transmit signal and the second amplified transmit signal. In accordance with various embodiments, the wireless device further includes a second combiner including a first input coupled to a receive terminal of the first antenna-side circulator and a second input coupled to a receive terminal of the second antenna-side circulator and configured to generate the receive signal. According to some embodiments, the wireless device further includes a first phase shifter coupled between an antenna terminal of the first antenna-side circulator and the first combiner, a second phase shifter coupled between the second output of the transmit amplifier circuitry and a transmit terminal of the second antenna-side circulator, and a third phase shifter coupled between a receive terminal of the second antenna-side circulator and the second input of the second combiner.

In several embodiments, the wireless device further includes a push-pull transmit amplifier configured to receive a transmit signal received from the cable to generate a pair of quadrature transmit signals at a first output and a second output, the first antenna-side circulator coupled between the first output and the antenna and the second antenna-side circulator coupled between the second output and the antenna. According to a number of embodiments, the wireless device further includes a first balun configured to combine the first amplified transmit signal and the second amplified transmit signal to generate a combined transmit signal for the antenna. In accordance with some embodiments, the wireless device further includes a second balun coupled to a receive terminal of the first antenna-side circulator and to a receive terminal of the second antenna-side circulator and configured to generate the receive signal. According to some embodiments, the wireless device further includes a first phase shifter coupled between an antenna terminal of the first antenna-side circulator and the first balun, a second phase shifter coupled between the second output of the push-pull transmit amplifier and a transmit terminal of the second antenna-side circulator, and a third phase shifter coupled between a receive terminal of the second antenna-side circulator and the second balun.

In various embodiments, the wireless device further includes a first hybrid coupler configured to receive a transmit signal from the cable and to generate a pair of quadrature transmit signals at a first output and a second output, the first antenna-side circulator coupled between the first output and the antenna and the second antenna-side circulator coupled between the second output and the antenna. According to a number of embodiments, the wireless device further includes a second hybrid coupler for combining the first amplified transmit signal and the second amplified transmit signal to generate a combined transmit signal for the antenna. In accordance with several embodiments, the wireless device further includes a third hybrid coupler coupled to a receive terminal of the first antenna-side circulator and to a receive terminal of the second antenna-side circulator and configured to generate the receive signal. According to some embodiments, the wireless device further includes a first transmit amplifier coupled between the first output and a transmit terminal of the first antenna-side circulator, and a second transmit amplifier coupled between the second output and a transmit terminal of the second antenna-side circulator.

In certain embodiments, the present disclosure relates to a remote compensator for a wireless device. The remote compensator includes a cable-side circulator coupled to a cable port, a receive amplifier configured to amplify a receive signal from an antenna port to provide an amplified receive signal to the cable port by way of the cable-side circulator, and a first antenna-side circulator and a second antenna-side circulator each coupled along a transmit path from the cable port to the antenna port, the first antenna-side circulator and the second antenna-side circulator configured to compensate the receive signal for transmit leakage arising from the transmit path.

In several embodiments, the remote compensator further includes a transmit amplifier having an input connected to the cable-side circulator and an output connected to the second antenna-side circulator, the first antenna-side circulator connected between the second antenna-side circulator and the antenna port. According to various embodiments, the remote compensator further includes a combiner configured to generate the receive signal at an output and coupled to the first antenna-side circulator at a first input, and a phase shifter coupled between the second antenna-side circulator and a second input of the combiner.

In some embodiments, the remote compensator further includes transmit amplifier circuitry configured to generate a first amplified transmit signal at a first output and a second amplified transmit signal at a second output based on amplifying and splitting a transmit signal received from the cable port, the first antenna-side circulator coupled between the first output and antenna port and the second antenna-side circulator coupled between the second output and the antenna port. According to several embodiments, the remote compensator further includes a first combiner for combining the first amplified transmit signal and the second amplified transmit signal. In accordance with various embodiments, the remote compensator further includes a second combiner including a first input coupled to a receive terminal of the first antenna-side circulator and a second input coupled to a receive terminal of the second antenna-side circulator and configured to generate the receive signal. According to several embodiments, the remote compensator further includes a first phase shifter coupled between an antenna port of the first antenna-side circulator and the first combiner, a second phase shifter coupled between the second output of the transmit amplifier circuitry and a transmit terminal of the second antenna-side circulator, and a third phase shifter coupled between a receive terminal of the second antenna-side circulator and the second input of the second combiner.

In various embodiments, the remote compensator further includes a push-pull transmit amplifier configured to receive a transmit signal received from the cable port to generate a pair of quadrature transmit signals at a first output and a second output, the first antenna-side circulator coupled between the first output and the antenna port and the second antenna-side circulator coupled between the second output and the antenna port. According to a number of embodiments, the remote compensator further includes a first balun configured to combine the first amplified transmit signal and the second amplified transmit signal to generate a combined transmit signal for the antenna port. In accordance with several embodiments, the remote compensator further includes a second balun coupled to a receive terminal of the first antenna-side circulator and to a receive terminal of the second antenna-side circulator and configured to generate the receive signal. According to a number of embodiments, the remote compensator further includes a first phase shifter coupled between an antenna terminal of the first antenna-side circulator and the first balun, a second phase shifter coupled between the second output of the push-pull transmit amplifier and a transmit terminal of the second antenna-side circulator, and a third phase shifter coupled between a receive terminal of the second antenna-side circulator and the second balun.

In some embodiment, the remote compensator further includes a first hybrid coupler configured to receive a transmit signal from the cable port and to generate a pair of quadrature transmit signals at a first output and a second output, the first antenna-side circulator coupled between the first output and the antenna port and the second antenna-side circulator coupled between the second output and the antenna port. According to several embodiments, the remote compensator further includes a second hybrid coupler for combining the first amplified transmit signal and the second amplified transmit signal to generate a combined transmit signal for the antenna port. In accordance with a number of embodiments, the remote compensator further includes a third hybrid coupler coupled to a receive terminal of the first antenna-side circulator and to a receive terminal of the second antenna-side circulator and configured to generate the receive signal. According to various embodiments, the remote compensator further includes a first transmit amplifier coupled between the first output and a transmit terminal of the first antenna-side circulator, and a second transmit amplifier coupled between the second output and a transmit terminal of the second antenna-side circulator.

In certain embodiments, the present disclosure relates to a packaged module for a wireless device. The packaged module includes a package substrate, a cable-side circulator attached to the package substrate and coupled to a cable pad, a semiconductor die attached to the package substrate and including a receive amplifier configured to amplify a receive signal from an antenna pad to provide an amplified receive signal to the cable pad by way of the cable-side circulator, and a first antenna-side circulator and a second antenna-side circulator each attached to the package substrate and each coupled along a transmit path from the cable pad to the antenna pad, the first antenna-side circulator and the second antenna-side circulator configured to compensate the receive signal for transmit leakage arising from the transmit path.

In some embodiments, the semiconductor die further includes a transmit amplifier having an input connected to the cable-side circulator and an output connected to the second antenna-side circulator, the first antenna-side circulator connected between the second antenna-side circulator and the antenna pad. According to a number of embodiments, the packaged module further includes a combiner configured to generate the receive signal at an output and coupled to the first antenna-side circulator at a first input, and a phase shifter coupled between the second antenna-side circulator and a second input of the combiner.

In several embodiments, the semiconductor die further includes transmit amplifier circuitry configured to generate a first amplified transmit signal at a first output and a second amplified transmit signal at a second output based on amplifying and splitting a transmit signal received from the cable pad, the first antenna-side circulator coupled between the first output and antenna pad and the second antenna-side circulator coupled between the second output and the antenna pad. According to a number of embodiments, the packaged module further includes a first combiner for combining the first amplified transmit signal and the second amplified transmit signal. According to various embodiments, the packaged module further includes a second combiner including a first input coupled to a receive terminal of the first antenna-side circulator and a second input coupled to a receive terminal of the second antenna-side circulator and configured to generate the receive signal. In accordance with some embodiments, the packaged module further includes a first phase shifter coupled between an antenna pad of the first antenna-side circulator and the first combiner, a second phase shifter coupled between the second output of the transmit amplifier circuitry and a transmit terminal of the second antenna-side circulator, and a third phase shifter coupled between a receive terminal of the second antenna-side circulator and the second input of the second combiner.

In several embodiments, the semiconductor die further includes a push-pull transmit amplifier configured to receive a transmit signal received from the cable pad to generate a pair of quadrature transmit signals at a first output and a second output, the first antenna-side circulator coupled between the first output and the antenna pad and the second antenna-side circulator coupled between the second output and the antenna pad. According to various embodiments, the packaged module further includes a first balun configured to combine the first amplified transmit signal and the second amplified transmit signal to generate a combined transmit signal for the antenna pad. In accordance with a number of embodiments, the packaged module further includes a second balun coupled to a receive terminal of the first antenna-side circulator and to a receive terminal of the second antenna-side circulator and configured to generate the receive signal. According to some embodiments, the packaged module further includes a first phase shifter coupled between an antenna terminal of the first antenna-side circulator and the first balun, a second phase shifter coupled between the second output of the push-pull transmit amplifier and a transmit terminal of the second antenna-side circulator, and a third phase shifter coupled between a receive terminal of the second antenna-side circulator and the second balun.

In some embodiments, the packaged module further includes a first hybrid coupler configured to receive a transmit signal from the cable pad and to generate a pair of quadrature transmit signals at a first output and a second output, the first antenna-side circulator coupled between the first output and the antenna pad and the second antenna-side circulator coupled between the second output and the antenna pad. According to a number of embodiments, the packaged module further includes a second hybrid coupler for combining the first amplified transmit signal and the second amplified transmit signal to generate a combined transmit signal for the antenna pad. In accordance with several embodiments, the packaged module further includes a third hybrid coupler coupled to a receive terminal of the first antenna-side circulator and to a receive terminal of the second antenna-side circulator and configured to generate the receive signal. According to various embodiments, the semiconductor die further includes a first transmit amplifier coupled between the first output and a transmit terminal of the first antenna-side circulator, and a second transmit amplifier coupled between the second output and a transmit terminal of the second antenna-side circulator.

In certain embodiments, the present disclosure relates to a wireless device. The wireless device includes a cable, a transmit antenna and a receive antenna, and a remote compensator. The remote compensator includes a cable-side multiplexer coupled to the cable, a transmit antenna-side multiplexer coupled to the transmit antenna, a first cable-side circulator coupled to the cable-side multiplexer, a first transmit amplifier coupled between the first cable-side circulator and the transmit antenna-side multiplexer and configured to amplify a first transmit signal received from the cable and to provide a first amplified transmit signal to the transmit antenna, a receive antenna-side multiplexer coupled to the receive antenna, and a first receive amplifier coupled between the receive antenna-side multiplexer and the first cable-side circulator and configured to amplify a first receive signal received from the receive antenna and to provide a first amplified receive signal to the cable.

In some embodiments, the wireless device further includes a second cable-side circulator coupled to the cable-side multiplexer, a second transmit amplifier coupled between the second cable-side circulator and the transmit antenna-side multiplexer, and a second receive amplifier coupled between the receive antenna-side multiplexer and the second cable-side circulator. According to a number of embodiments, the wireless device further includes a third cable-side circulator coupled to the cable-side multiplexer, a third transmit amplifier coupled between the third cable-side circulator and the transmit antenna-side multiplexer, and a third receive amplifier coupled between the receive antenna-side multiplexer and the third cable-side circulator.

In certain embodiments, the present disclosure relates to a remote compensator for a wireless device. The remote compensator includes a cable-side circulator coupled to a cable port, a transmit antenna-side multiplexer coupled to a transmit antenna port, a first cable-side circulator coupled to the cable-side multiplexer, a first transmit amplifier coupled between the first cable-side circulator and the transmit antenna-side multiplexer and configured to amplify a first transmit signal received from the cable and to provide a first amplified transmit signal to the transmit antenna port, a receive antenna-side multiplexer coupled to a receive antenna port, and a first receive amplifier coupled between the receive antenna-side multiplexer and the first cable-side circulator and configured to amplify a first receive signal received from the receive antenna port and to provide a first amplified receive signal to the cable.

In some embodiments, the remote compensator further includes a second cable-side circulator coupled to the cable-side multiplexer, a second transmit amplifier coupled between the second cable-side circulator and the transmit antenna-side multiplexer, and a second receive amplifier coupled between the receive antenna-side multiplexer and the second cable-side circulator. According to several embodiments, the remote compensator of claim 106 further includes a third cable-side circulator coupled to the cable-side multiplexer, a third transmit amplifier coupled between the third cable-side circulator and the transmit antenna-side multiplexer, and a third receive amplifier coupled between the receive antenna-side multiplexer and the third cable-side circulator.

In certain embodiments, the present disclosure relates to a packaged module for a wireless device. The packaged module includes a package substrate, a plurality of circulators including a cable-side circulator attached to the package substrate and coupled to a cable pad, and a first cable-side circulator attached to the package substrate and coupled to the cable-side multiplexer, a plurality of multiplexers including a transmit antenna-side multiplexer attached to the package substrate and coupled to a transmit antenna pad, and a receive antenna-side multiplexer attached to the package substrate and coupled to a receive antenna pad, and a semiconductor die including a first transmit amplifier coupled between the first cable-side circulator and the transmit antenna-side multiplexer and configured to amplify a first transmit signal received from the cable and to provide a first amplified transmit signal to the transmit antenna pad, and a first receive amplifier coupled between the receive antenna-side multiplexer and the first cable-side circulator and configured to amplify a first receive signal received from the receive antenna pad and to provide a first amplified receive signal to the cable.

In some embodiments, the plurality of circulators further include a second cable-side circulator coupled to the cable-side multiplexer, the semiconductor die further including a second transmit amplifier coupled between the second cable-side circulator and the transmit antenna-side multiplexer and a second receive amplifier coupled between the receive antenna-side multiplexer and the second cable-side circulator. According to various embodiments, the plurality of circulators further include a third cable-side circulator coupled to the cable-side multiplexer, the semiconductor die further including a third transmit amplifier coupled between the third cable-side circulator and the transmit antenna-side multiplexer and a third receive amplifier coupled between the receive antenna-side multiplexer and the third cable-side circulator.

BRIEF DESCRIPTION OF THE DRAWINGS

Embodiments of this disclosure will now be described, by way of non-limiting example, with reference to the accompanying drawings.

FIG. 6A is a schematic diagram of another embodiment of a communication system with remote compensation.

FIG. 6B is a schematic diagram of another embodiment of a communication system with remote compensation.

DETAILED DESCRIPTION OF CERTAIN EMBODIMENTS

Figure 1:
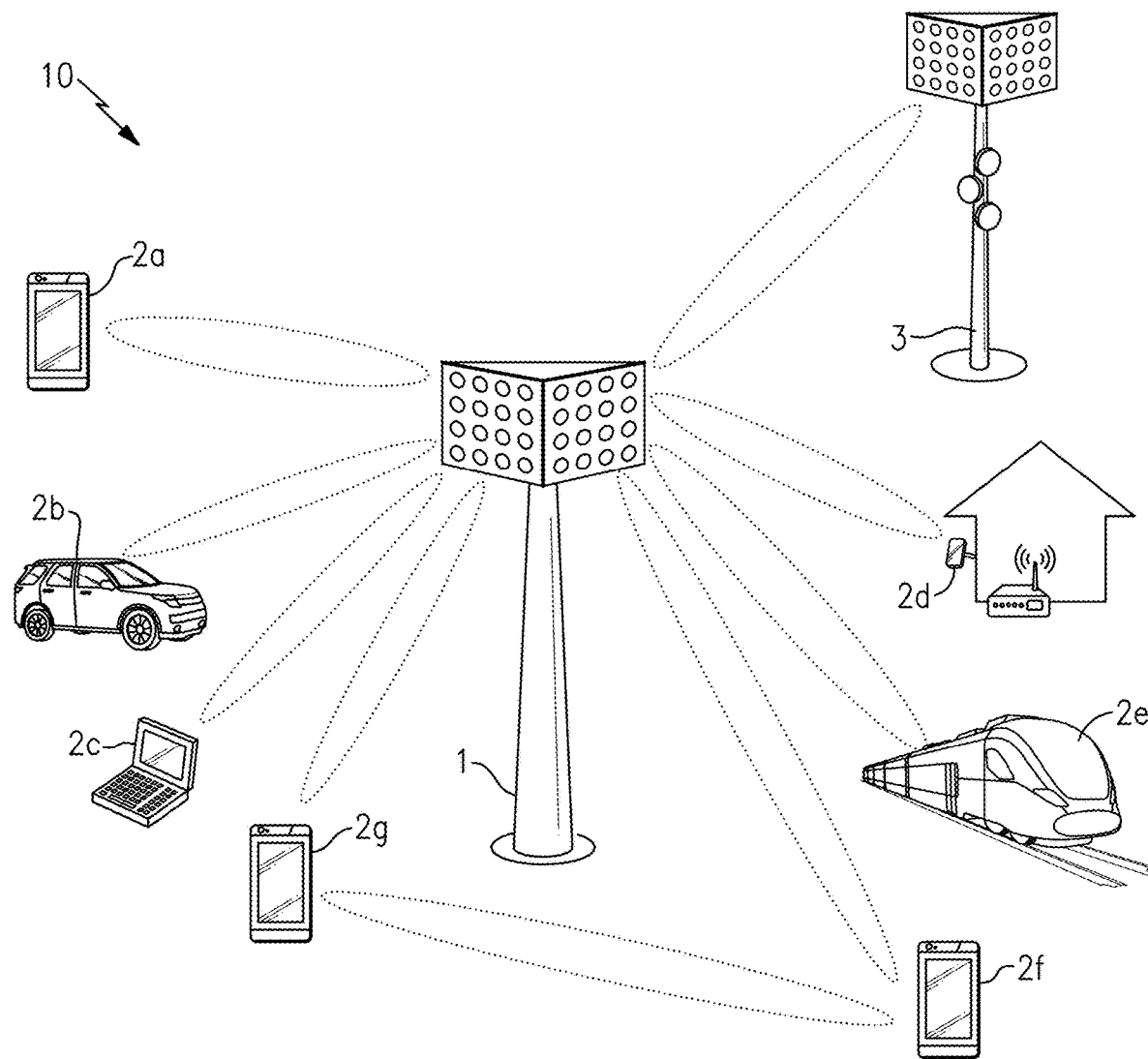
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
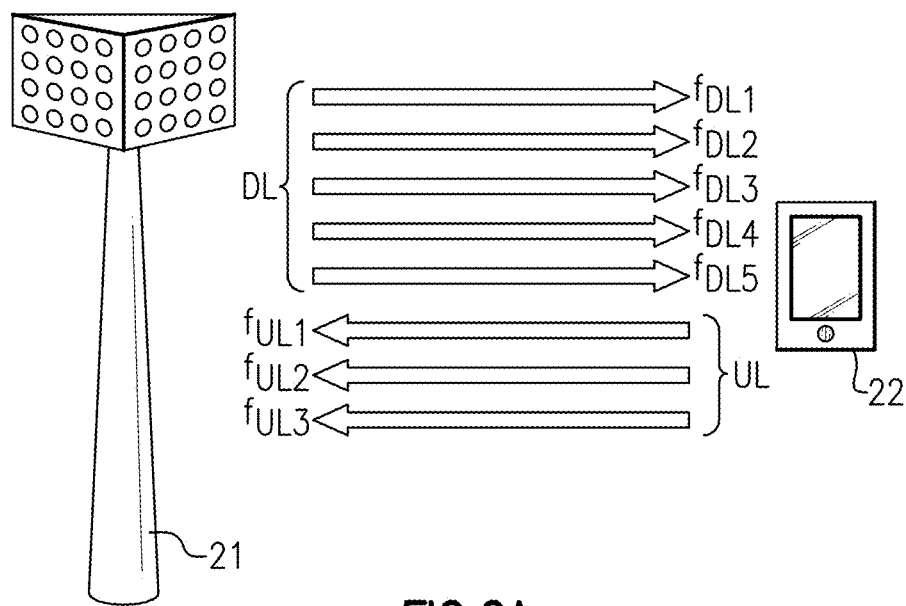
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
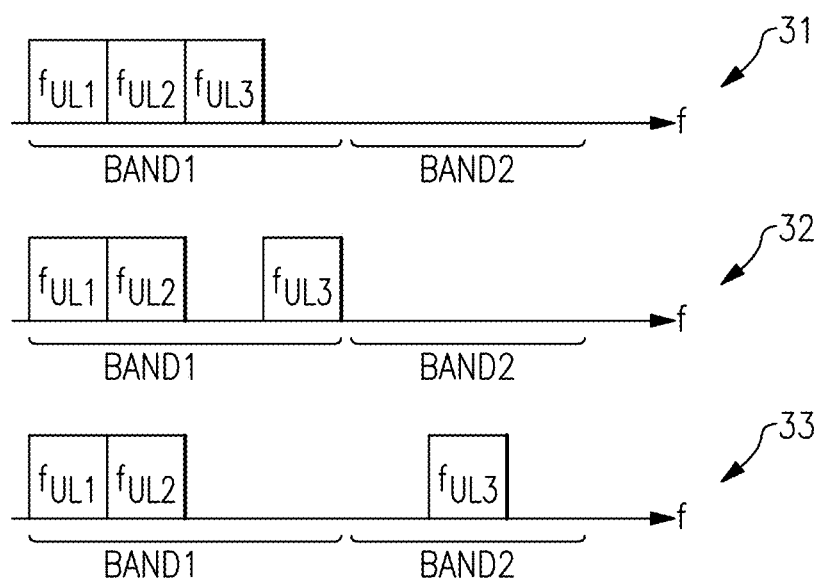
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
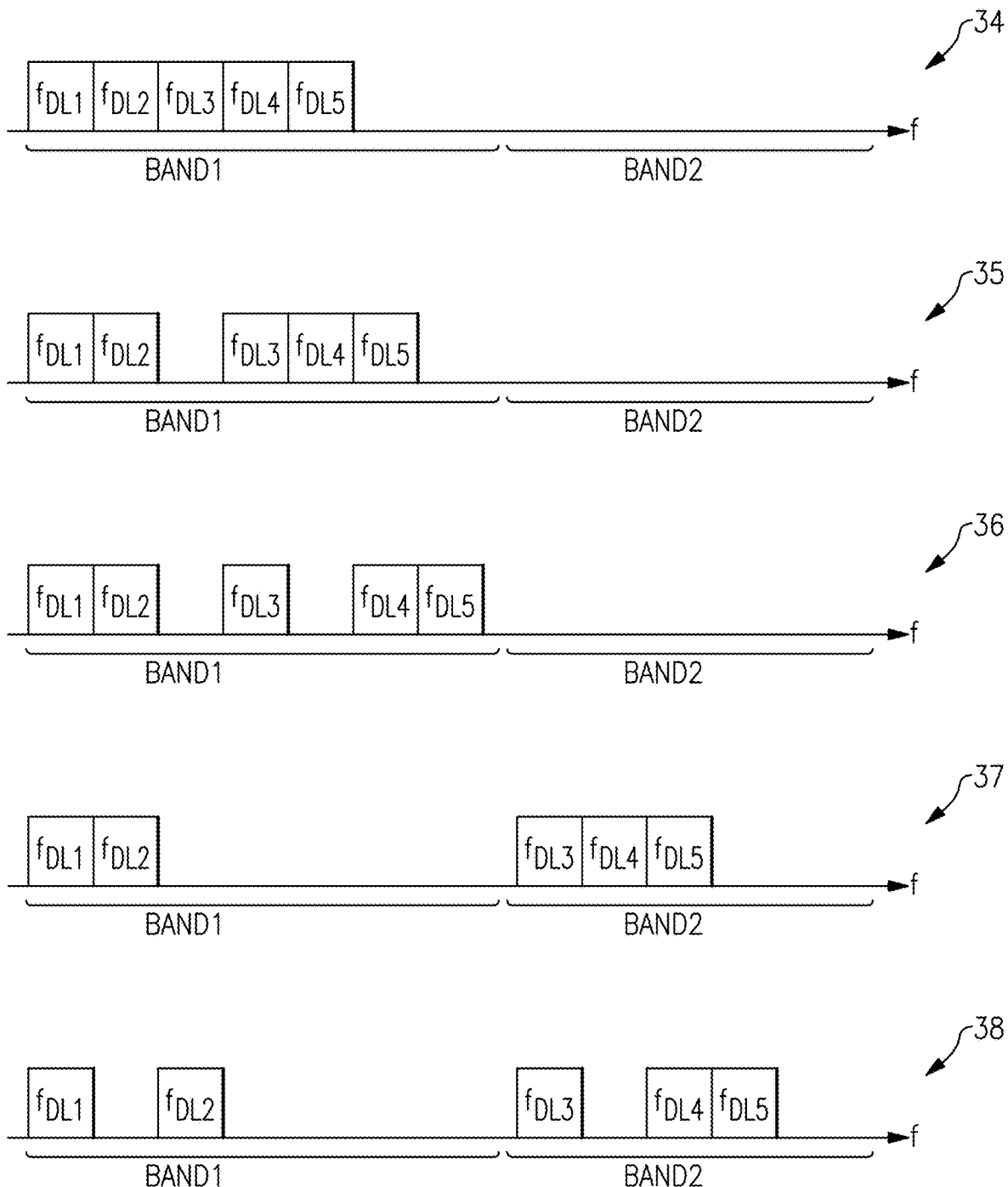
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier fru, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
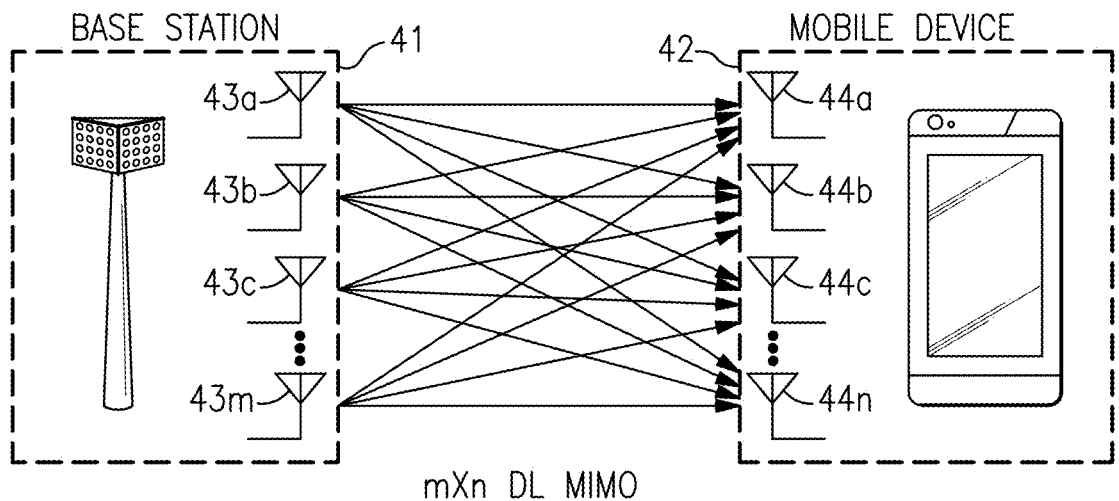
FIG. 3A is a schematic diagram of one example of a downlink channel using multi-input and multi-output (MIMO) communications.
Figure 3B:
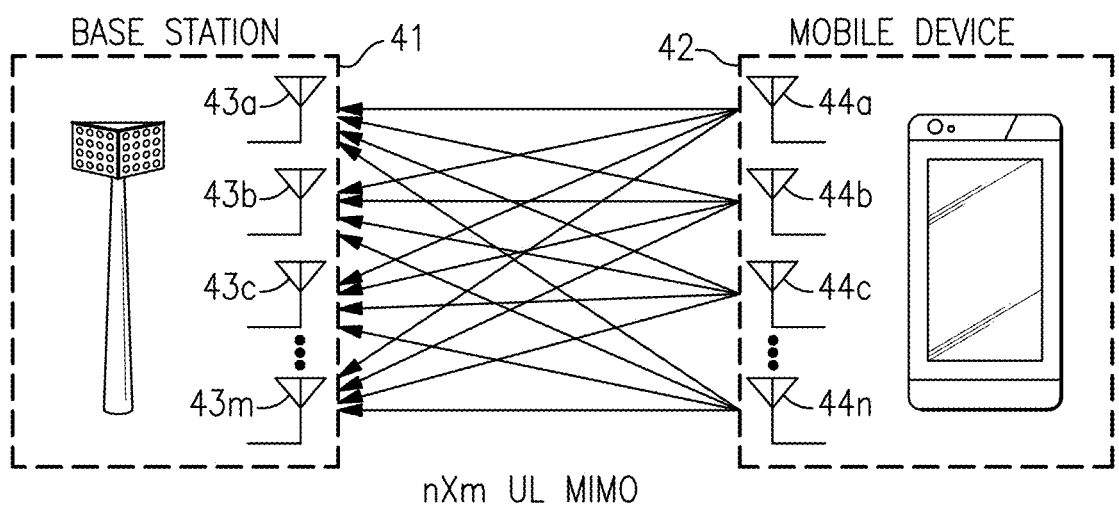
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas $43a$, $43b$, $43c$, . . . $43m$ of the base station 41 and receiving using N antennas $44a$, $44b$, $44c$, . . . $44n$ of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas $44a$, $44b$, $44c$, . . . $44n$ of the mobile device 42 and receiving using M antennas $43a$, $43b$, $43c$, . . . $43m$ of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
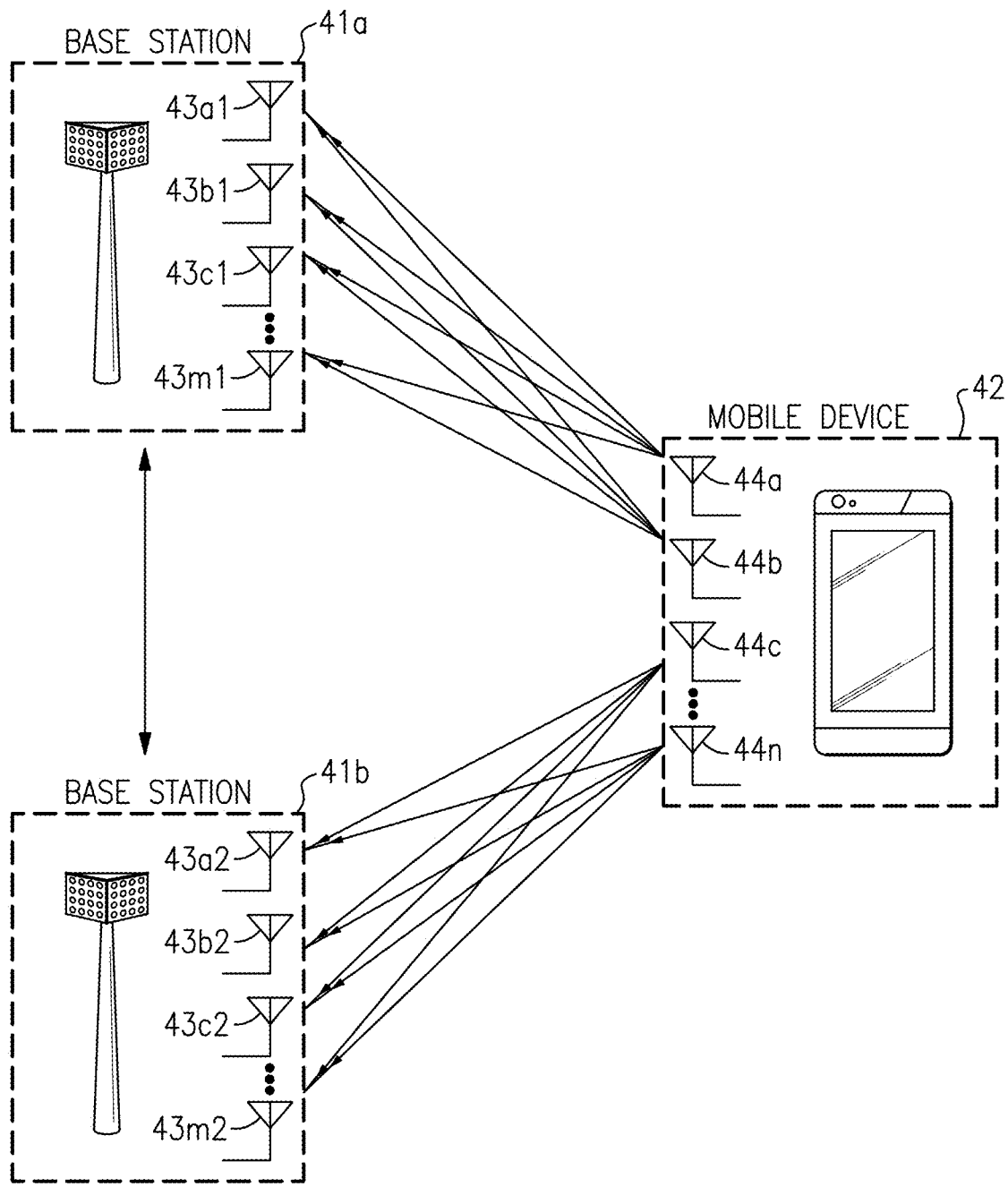
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas $44a$, $44b$, $44c$, . . . $44n$ of the mobile device 42. Additional a first portion of the uplink transmissions are received using M antennas $43a1$, $43b1$, $43c1$, . . . $43m1$ of a first base station $41a$, while a second portion of the uplink transmissions are received using M antennas $43a2$, $43b2$, $43c2$, . . . $43m2$ of a second base station $41b$. Additionally, the first base station $41a$ and the second base station $41b$ communication with one another over wired, optical, and/or wireless links.

The MIMO scenario of FIG. 3C illustrates an example in which multiple base stations cooperate to facilitate MIMO communications.

Remote Compensators for Communication Systems

In radio architectures (for instance, mobile devices such as smart phones) that suffer from large losses between a radio frequency (RF) front-end and an antenna, a remote compensator can be included to amplify RF signals, thereby boosting signal strength. For example, such remote compensators can provide boosting of RF transmit signals and RF receive signals before the negative impact of the loss is suffered between the antenna and the rest of the radio. Such losses can arise from a variety of sources, such as long and/or lossy cables for reaching a remotely placed antenna. Not only can such cables be present in mobile phones, but in other types of user equipment (UE), such as vehicles.

Although remote compensators can boost signals to mitigate the impacts of loss, certain remote compensators are unable to support simultaneous bi-directionality. For example, such remote compensators can select either transmit or receive for amplification, but not both at the same time. Furthermore, in applications in which multiple transmit signals in different band groups operate simultaneously (for instance, uplink carrier aggregation and/or 5G NR dual connectivity (EN-DC) uses cases), filtering by band is needed to maintain signaling specifications. For example, absent band filtering in such remote compensators, amplifier linearity is insufficient to support signal integrity and/or intermodulation-limited emissions.

Remote compensators for communications systems are provided herein. In certain implementations, a communication system includes a cable, an antenna, and a remote compensator electrically connected between the cable and the antenna. The remote compensator includes a cable-side multiplexer coupled to the cable, an antenna-side multiplexer coupled to the antenna, at least one cable-side circulator, at least one antenna-side circulator, at least one transmit amplifier, and at least one receive amplifier. The at least one transmit amplifier provides one or more amplified transmit signals to the antenna by way of the at least one antenna-side circulator and the antenna-side multiplexer, and the at least one receive amplifier provides one or more amplified receive signals to the cable by way of the at least one cable-side circulator and the cable-side multiplexer.

Implementing the remote compensator in this manner provides a number of advantages, such as support for broadband carrier aggregation and/or EN-DC uses cases.

In certain implementations, the cable-side multiplexer extracts a DC supply voltage from the cable and provides the DC supply voltage to the at least one transmit amplifier and/or at least one receive amplifier. Thus, the cable can be used not only to carry RF signals bidirectionally, but also to provide DC power to the remote compensator.

Additionally or alternatively, in some implementations the antenna-side multiplexer extracts a DC antenna voltage from the antenna and provides the DC antenna voltage for processing. For example, the DC antenna voltage can be processed to check the electrical status of the antenna to detect, for instance, whether the antenna is disconnected (for instance, an electrical open), shorted, and/or damaged.

In certain implementations, the cable-side multiplexer and the antenna-side multiplexer provide band filtering, with multiple circulators and amplifiers provided for handling processing of multiple frequency bands. For example, with respect to signal transmission, the cable-side multiplexer can partition a transmit signal from the cable into two or more transmit signals of different frequency bands, and provide the two or more transmit signals to two or more transmit amplifiers by way of two or more cable-side circulators. Additionally, the two or more amplified transmit signals from the two or more transmit amplifiers can be provided to the antenna by way of two or more antenna-side circulators and the antenna-side multiplexer. Thus, the antenna-side multiplexer can combine the two or more amplified transmit signals to generate an amplified transmit signal that is wirelessly transmitted using the antenna.

Additionally, with respect to signal reception, the antenna-side multiplexer can partition a receive signal from the antenna into two or more receive signals of different frequency bands, and provide the two or more receive signals to two or more receive amplifiers by way of the two or more antenna-side circulators. Additionally, the two or more amplified receive signals from the two or more receive amplifiers can be provided to the cable by way of the two or more cable-side circulators and the cable-side multiplexer. Thus, the antenna-side multiplexer can combine the two or more receive transmit signals to generate an amplified receive signal that is provided to the cable.

In certain implementations, the cable-side multiplexer and/or the antenna-side multiplexer are implemented, as a diplexer, triplexer, quadplexer, k-plexer (where k is greater than or equal to 5), and/or other frequency multiplexing structure.

The cable can be electrically connected to a wide range of circuitry of the communication system. For example, one end of the cable can connect to the remote compensator while the other end of the cable can connect to a front-end system, transceiver, or other suitable circuit of the communication system. In certain implementations, the cable corresponds to a cross-UE cable.

In certain implementations, the at least one transmit amplifier includes one or more power amplifiers (PAs) and/or the at least one receive amplifier includes one or more low noise amplifiers (LNAs).

Communication systems with remote compensators can be implemented in a wide range of RF electronics, including, but not limited to, base stations, network access points, mobile phones, tablets, customer-premises equipment (CPE), laptops, computers, wearable electronics, and/or other communication devices. Additionally, the remote compensators can amplify signals of a wide variety of frequencies, including radio frequency signals associated with decimeter wave carriers (for instance, 300 MHz to 3 GHz), centimeter wave carriers (for instance, 3 GHz to 30 GHz), and/or millimeter wave carriers (for instance 30 GHz to 300 GHz).

Figure 4:
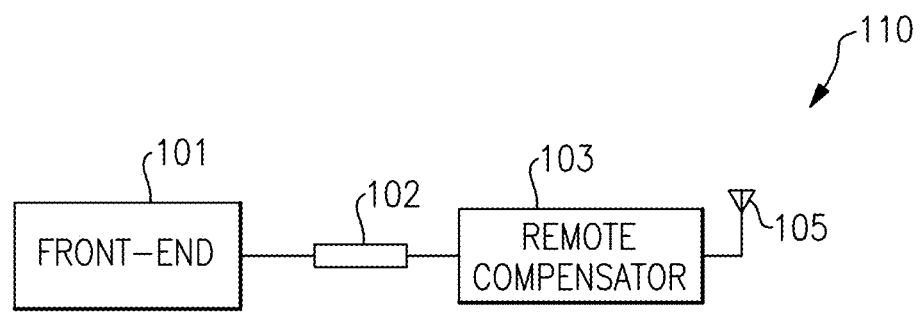
FIG. 4 is a schematic diagram of one embodiment of a communication system with remote compensation.

FIG. 4 is a schematic diagram of one embodiment of a communication system 110 with remote compensation. The communication system 110 includes a front-end system 101, a cable 102, a remote compensator 103, and an antenna 105.

Although the remote compensator 103 is depicted as being connected to the front-end system 101, other implementations are possible. For example, the cable 102 can be used to connect the remote compensator 103 to any other suitable circuit, including, but not limited to, a transceiver. In another embodiment, the remote compensator 103 is connected to the front-end system and/or other circuit by way of a conductor that is not a cable, for instance, a long and/or lossy conductive trace of a printed circuit board (PCB), In the illustrated embodiment, the front-end system 101 provides the remote compensator 103 with an RF transmit signal over the cable 102. Additionally, the remote compensator 103 amplifies the RF transmit signal to generate an amplified RF transmit signal that is wirelessly transmitted by the antenna 105. The remote compensator 103 also receives an RF receive signal from the antenna 105, and amplifies the RF receive signal to generate an amplified RF receive signal that is provided to the front-end system 101 over the cable 102.

The remote compensator 103 can be implemented in accordance with any of the embodiments herein.

Figure 5:
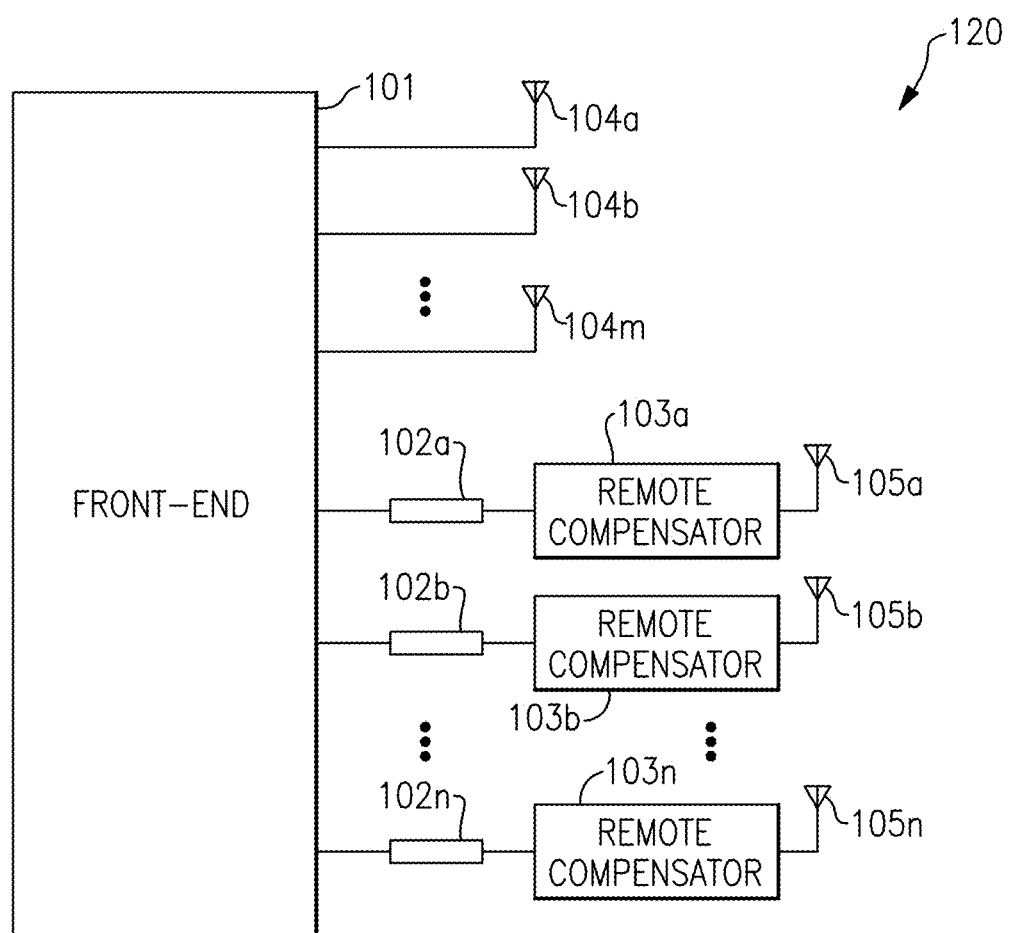
FIG. 5 is a schematic diagram of another embodiment of a communication system with remote compensation.

FIG. 5 is a schematic diagram of another embodiment of a communication system 120 with remote compensation. The communication system 120 includes a front-end system 101, a first group of antennas 104a, 104b, . . . 104m, cables 102a, 102b, . . . 102n, remote compensators 103a, 103b, . . . 103n, and a second group of antennas 105a, 105b, . . . 105n.

In the illustrated embodiment, the front-end system 101 is electrically connected without the use of cables to the first group of antennas 104a, 104b, . . . 104m. For example, the front end-system 101 can be in relatively close proximity to the antennas 104a, 104b, . . . 104m. The first group of antennas 104a, 104b, . . . 104m can include any number of antennas m.

With continuing reference to FIG. 5, the front-end system 101 is connected by the cables 102a, 102b, . . . 102n to the remote compensators 103a, 103b, . . . 103n, respectively. The remote compensators 103a, 103b, . . . 103n are connected to the second group of antennas 105a, 105b, . . . 105n, respectively. The second group of antennas 105a, 105b, . . . 105m can include any number of antennas n, which can be the same or different as m.

The front-end system 101 utilizes the cables 102a, 102b, . . . 102n to reach the remote compensators 103a, 103b, . . . 103n and second group of antennas 105a, 105b, . . . 105n, which are remotely placed from the front-end system 101, in this example. Absent inclusion of the remote compensators 103a, 103b, . . . 103n, the signal loss of the cables 102a, 102b, . . . 102n can lead to a degradation in receive sensitivity, transmit power, and/or signal degradation. Thus, the remote compensators 103a, 103b, . . . 103n provide bidirectional boosting of RF signals before the negative impact of cable losses is suffered.

The remote compensators 103a, 103b, . . . 103n can be implemented in accordance with any of the embodiments herein.

FIG. 6A is a schematic diagram of another embodiment of a communication system 130 with remote compensation. The communication system 130 includes a cable 102, an antenna 105, and a remote compensator 123.

As shown in FIG. 6A, the cable 102 connects the remote compensator 123 to a radio frequency front-end (RFFE), radio, and/or other suitable circuit. Additionally, the remote compensator 123 is connected between the antenna 105 and the cable 102, in this embodiment.

In the illustrated embodiment, the remote compensator 123 includes a cable-side multiplexer 125, an antenna-side multiplexer 126, and compensator circuitry 127 including amplifiers 128 and circulators 129, in this embodiment. As shown in FIG. 6A, the cable-side multiplexer 125 extracts a DC supply voltage from the cable 102, and powers the compensator circuitry 127 using the DC supply voltage.

In certain implementations, the amplifiers 128 include a transmit amplifier and a receive amplifier, and the circulators 129 include a cable-side circulator and an antenna-side circulator. Additionally, the transmit amplifier receives a transmit signal from the cable 102 by way of the cable-side multiplexer 125 and the cable-side circulator, and provides an amplified transmit signal to the antenna 105 by way of the antenna-side circulator and the antenna-side multiplexer 126. Furthermore, the receive amplifier receives a receive signal from the antenna 105 by way of the antenna-side multiplexer 126 and the antenna-side circulator, and provides an amplified receive signal to the cable 102 by way of the cable-side circulator and the cable-side multiplexer 125.

FIG. 6B is a schematic diagram of another embodiment of a communication system 160 with remote compensation. The communication system 160 of FIG. 6B is similar to the communication system 130 of FIG. 6A, except that the communication system 160 of FIG. 6B includes a different implementation of a remote compensator 133.

For example, the remote compensator 133 of FIG. 6B includes a cable-side multiplexer 135, an antenna-side multiplexer 136, and compensator circuitry 127 including amplifiers 128 and circulators 129.

As shown in FIG. 6B, the cable-side multiplexer 135 includes a first bandpass section 141 for providing bandpass filtering of a first frequency band and a second bandpass section 142 for providing bandpass filtering of a second frequency band. Additionally, the antenna-side multiplexer 136 includes a first bandpass section 151 for providing bandpass filtering of the first frequency band and a second bandpass section 152 for providing bandpass filtering of the second frequency band. In certain implementations, the frequency bands correspond to 5G NR frequency bands, such as those used for carrier aggregation and/or EN-DC.

Although an example with two bandpass sections is shown, the cable-side multiplexer 135 and/or the antenna-side multiplexer 136 can include more or fewer bandpass sections.

In the illustrated embodiment, the cable-side multiplexer 135 and the antenna-side multiplexer 136 provide band filtering to generate band partitioned signals that are processed by the compensator circuitry 127.

For example, the circulators 129 can include a first cable-side circulator connected to the first bandpass section 141, a second cable-side circulator connected to the second bandpass section 142, a first antenna-side circulator connected to the first bandpass section 151, and a second antenna-side circulator connected to the second bandpass section 152. Additionally, the amplifiers 128 can include a transmit amplifier and a receive amplifier coupled between each cable-side circulator and corresponding antenna-side circulator.

Figure 7:
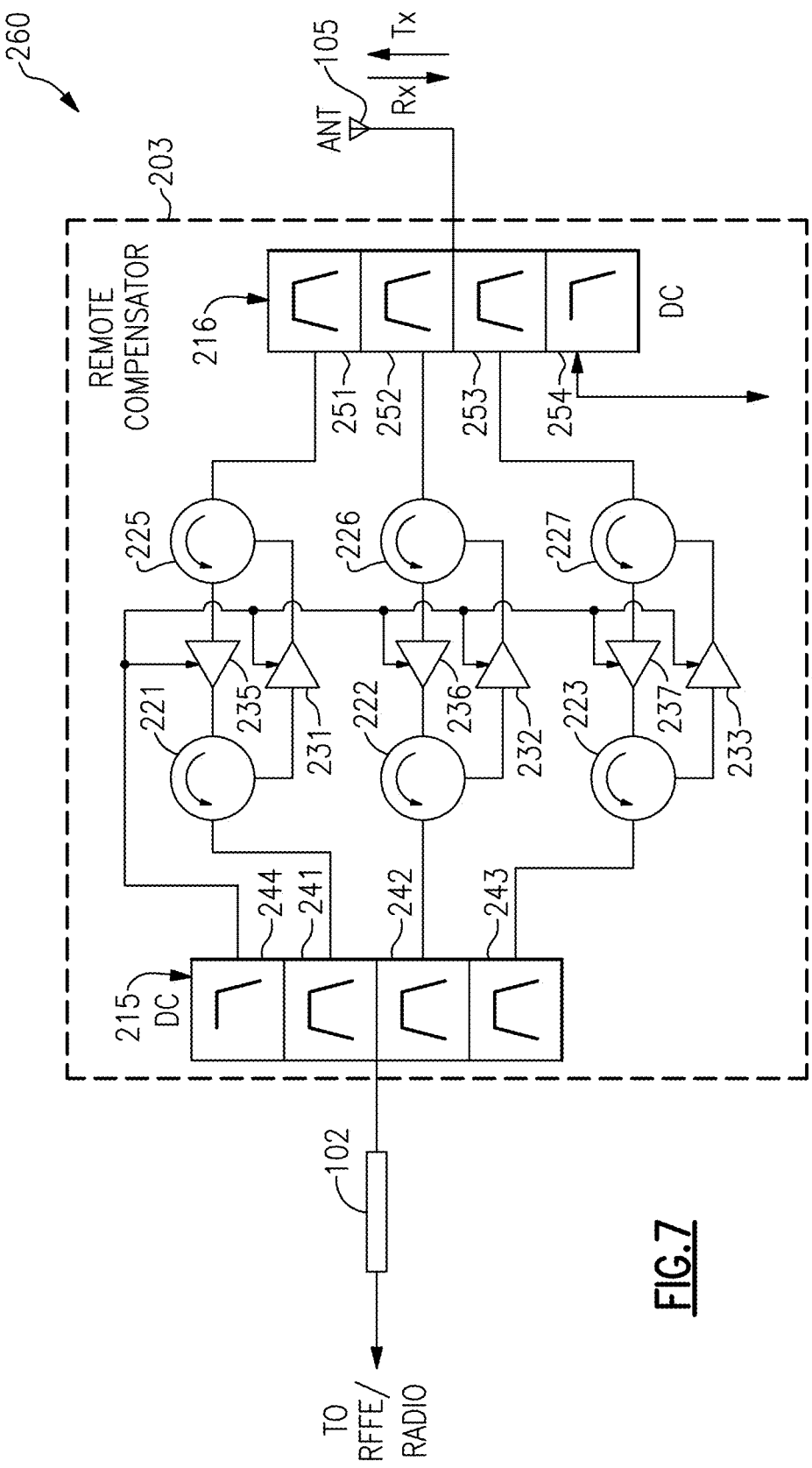
FIG. 7 is a schematic diagram of another embodiment of a communication system with remote compensation.

FIG. 7 is a schematic diagram of another embodiment of a communication system 260 with remote compensation. The communication system 260 of FIG. 7 is similar to the communication system 130 of FIG. 6A, except that the communication system 260 of FIG. 7 includes a different implementation of a remote compensator 203.

For example, the remote compensator 203 of FIG. 7 includes a cable-side multiplexer 215, an antenna-side multiplexer 216, a first cable-side circulator 221, a second cable-side circulator 222, a third cable-side circulator 223, a first antenna-side circulator 225, a second antenna-side circulator 226, a third antenna-side circulator 227, a first transmit amplifier 231, a second transmit amplifier 232, a third transmit amplifier 233, a first receive amplifier 235, a second receive amplifier 236, and a third receive amplifier 237.

Although one embodiment of a remote compensator is shown in FIG. 7, the teachings herein are applicable to remote compensators implemented in a wide variety of ways.

In the illustrated embodiment, the first cable-side circulator 221, the first transmit amplifier 231, the first receive amplifier 235, and the first antenna-side circulator 225 operate as a first RF channel connected between a first bandpass section 241 of the cable-side multiplexer 215 and a first bandpass section 251 of the antenna-side multiplexer 216. The first RF channel provides bidirectional amplification to RF signals of a first frequency band. Additionally, the second cable-side circulator 222, the second transmit amplifier 232, the second receive amplifier 236, and the second antenna-side circulator 226 operate as a second RF channel connected between a second bandpass section 242 of the cable-side multiplexer 215 and a second bandpass section 252 of the antenna-side multiplexer 216. The second RF channel provides bidirectional amplification to RF signals of a second frequency band. Furthermore, the third cable-side circulator 223, the third transmit amplifier 233, the third receive amplifier 237, and the third antenna-side circulator 227 operate as a third RF channel connected between a third bandpass section 243 of the cable-side multiplexer 215 and a third bandpass section 253 of the antenna-side multiplexer 216. The third RF channel provides bidirectional amplification to RF signals of a third frequency band.

Although an embodiment with three RF channels for processing transmit and receive signals of different bands is shown, more or fewer RF channels can be included.

Including multiple RF channels aids in providing support for broadband carrier aggregation and/or EN-DC uses cases. For example, the frequency bands can correspond to any frequency bands associated with broadband carrier aggregation and/or EN-DC for 5G and/or other applicable communication standards.

In the illustrated embodiment, the cable-side multiplexer 215 further includes a DC section 244 for providing a supply voltage from the cable 102 to the amplifiers of the remote compensator 203. Thus, the cable 102 can be used not only to carry RF signals bidirectionally, but also to provide DC power to the remote compensator 203.

As shown in FIG. 7, the antenna-side multiplexer 216 includes a DC section 254 that extracts a DC antenna voltage from the antenna 105 and provides the DC antenna voltage for processing. For example, the DC antenna voltage can be processed to check the electrical status of the antenna to detect, for instance, whether the antenna is disconnected (for instance, an electrical open), shorted, and/or damaged. The DC antenna voltage can be processed in any suitable way, for instance, by converting the DC antenna voltage to a digital signal, and processing the digital signal a digital processing circuit (including, but not limited to, a baseband system).

Figure 8:
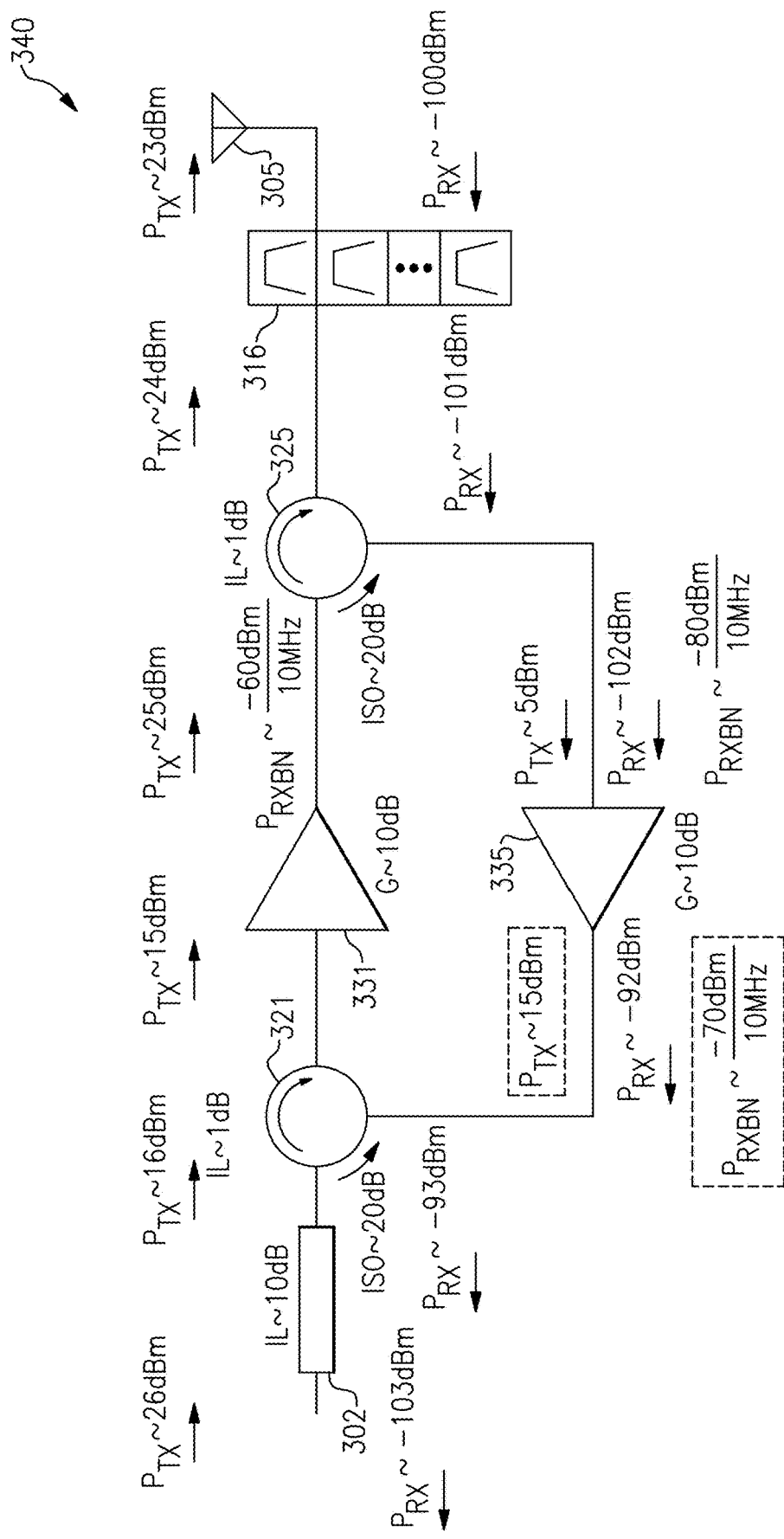
FIG. 8 is a schematic diagram of another embodiment of a communication system with remote compensation including annotations related to transmit and receive signal power levels.

FIG. 8 is a schematic diagram of another embodiment of a communication system 340 with remote compensation including annotations related to transmit and receive signal power levels. The communication system 340 includes a cable 302, an antenna 305, an antenna-side multiplexer 316, a cable-side circulator 321, an antenna-side circulator 325, a transmit amplifier 331, and a receive amplifier 335.

The communication system 340 has been annotated to show transmit and receive signal power levels at various points in the communication system 340.

The annotations depict a challenge related to transmit leakage (TxLkg) and receive band noise (RxBN) contributed by the uplink (UL) transmit amplifier 331 (for instance, a power amplifier) that leaks through the circulator architecture and degrades the downlink (DL) receive path at the input of the receive amplifier 335 (for instance, a low noise amplifier). One example of this challenge is quantified with annotations in FIG. 8 for an implementation using FDD operation.

Figure 9A:
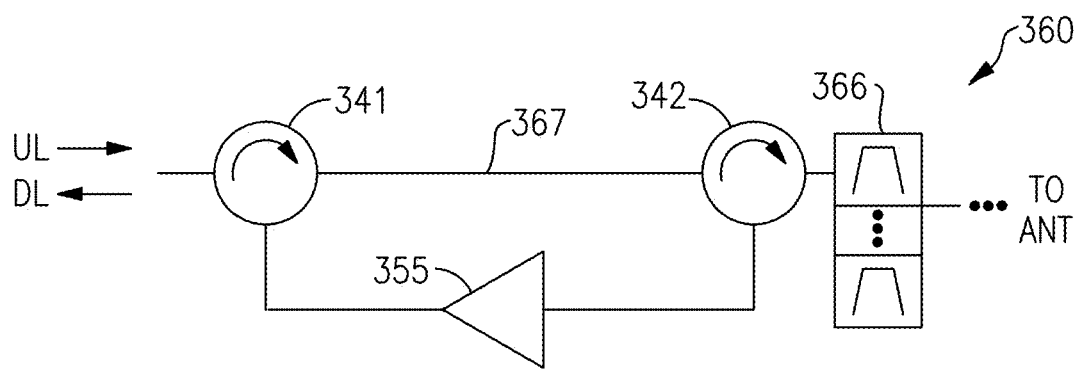
FIG. 9A is a schematic diagram of another embodiment of a communication system with remote compensation.

FIG. 9A is a schematic diagram of another embodiment of a communication system 360 with remote compensation. The communication system 360 includes an antenna-side multiplexer 366, a cable-side circulator 341, an antenna-side circulator 342, a receive amplifier 355, and a transmit bypass path 367.

In the illustrated embodiment a transmit amplifier (for instance, a power amplifier) has been omitted in favor of including the transmit bypass path 367, which does not provide gain.

In certain implementations herein, a remote compensator includes one or more receive amplifiers (for instance, LNAs) but omits any transmit amplifiers (for instance, power amplifiers). For example, such remote compensators can be suitable for use cases and frequency bands in which power amplifier (PA) TxLkg and RxBN are deemed too large for performance targets.

Thus, noise level will be as low as signal conditioned from the main RFFE, and the TxLkg can be managed with an LNA design. For instance, the LNA design can be implemented to operate with slightly higher DC current and/or 1 dB compression point (P1 dB) to manage the amplification. The TxLkg is further filtered downstream from this remote circuitry in the main RFFE.

Figure 9B:
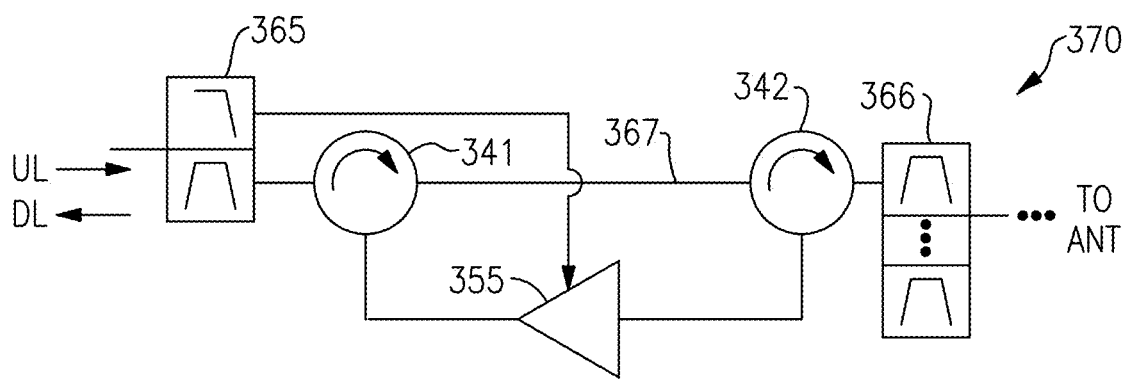
FIG. 9B is a schematic diagram of another embodiment of a communication system with remote compensation.

FIG. 9B is a schematic diagram of another embodiment of a communication system 370 with remote compensation.

The communication system 370 of FIG. 9B is similar to the communication system 360 of FIG. 9A except that the communication system 370 further includes a cable-side multiplexer 365, which provides DC power (a supply voltage) to the receive amplifier 355.

Figure 10:
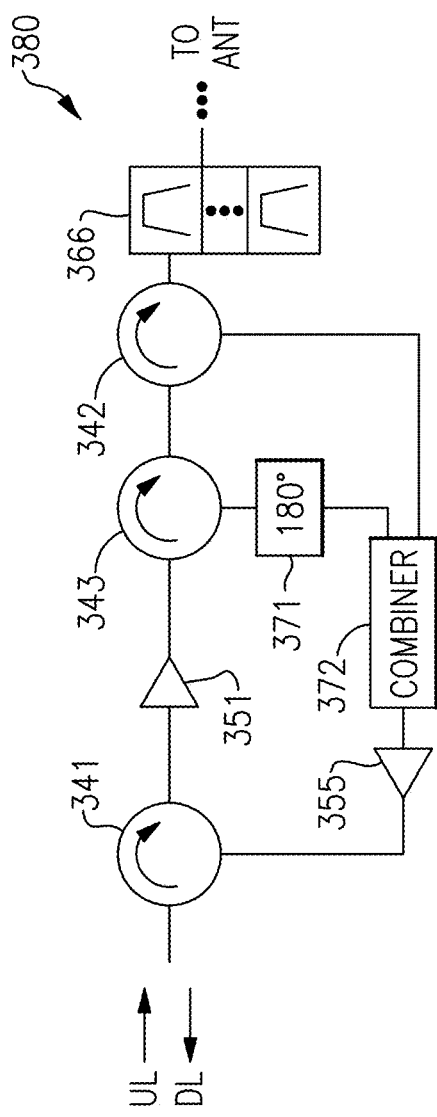
FIG. 10 is a schematic diagram of another embodiment of a communication system with remote compensation.

FIG. 10 is a schematic diagram of another embodiment of a communication system 380 with remote compensation. The communication system 380 includes an antenna-side multiplexer 366, a cable-side circulator 341, a first antenna-side circulator 342, a second antenna-side circulator 343, a transmit amplifier 351, a receive amplifier 355, a 180° phase shifter 371, and a combiner 372.

The communication system 380 includes circuitry for canceling or compensating for TxLkg and RxBN. For example, the second antenna-side circulator 343 and the first antenna-side circulator 342 are connected in cascade between the output of the transmit amplifier 351 (for instance, a power amplifier) and the antenna-side multiplexer 366. Additionally, the combiner 372 combines a phase shifted signal from the second antenna-side circulator 343 (phase shifted by about 180° by the 180° phase shifter 371) with a non-phase shifted signal from the first antenna-side circulator 342 to generate an input signal to the receive amplifier 355 (for instance, a low noise amplifier).

By implementing the communication system 380 in this manner, amplitude cancellation of the transmit leakage is provided.

For example, the second antenna-side circulator 343 suffers some TxLkg and RxBN from the output of the transmit amplifier 351, which is run through the ° 180 phase shifter 371 which can be broadband and implemented to account for the insertion loss and phase delay of the first antenna-side circulator 342.

With continuing reference to FIG. 10, the first antenna-side circulator 342 suffers similar TxLkg and RxBN (reduced by broadband loss and group delay).

The broadband amplitude and phase shifted leakage paths from the second antenna-side circulator 343 and the first antenna-side circulator 342 operate to cancel or compensate for undesired TxLkg and RxBN signal artifacts, and are then run into the combiner 372 (which can be broadband) to cancel these before the input of the receive amplifier 355.

The overall noise figure (NF) suffers the loss of the combiner 372 in the downlink path, but may still be attractive relative to up to 10 dB cable loss that may follow the remote compensator circuitry before getting back to the main RFFE.

Figure 11:
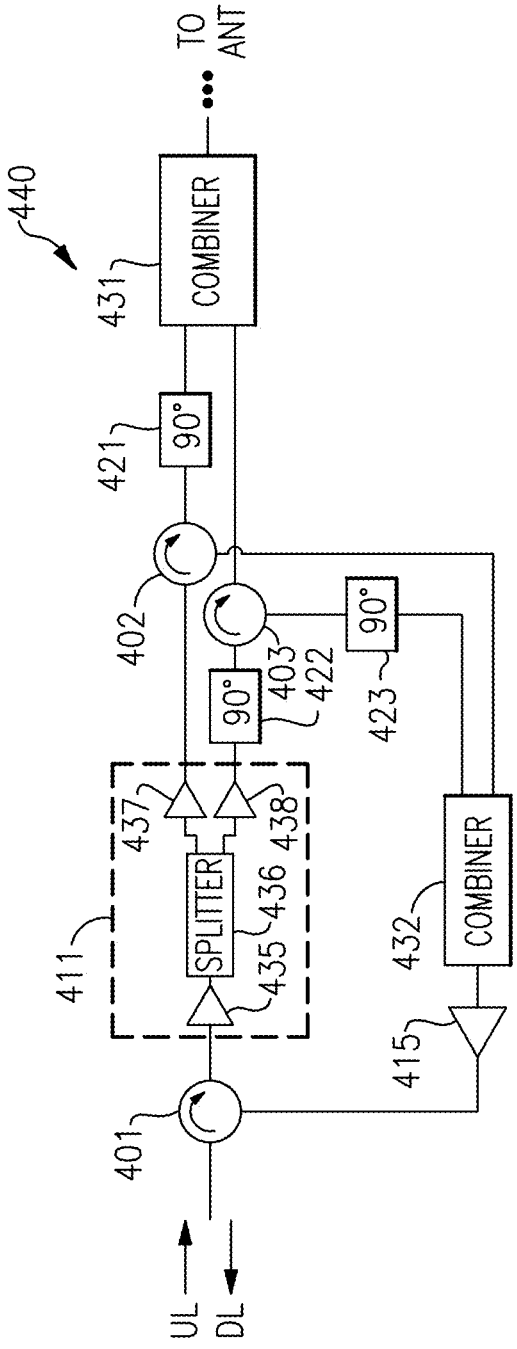
FIG. 11 is a schematic diagram of another embodiment of a communication system with remote compensation.

FIG. 11 is a schematic diagram of another embodiment of a communication system 440 with remote compensation. The communication system 440 includes a cable-side circulator 401, a first antenna-side circulator 402, a second antenna-side circulator 403, transmit amplification circuitry 411, a receive amplifier 415, a first 90° phase shifter 421, a second 90° phase shifter 422, a third 90° phase shifter 423, a first combiner 431, and a second combiner 432.

As shown in FIG. 11, the transmit amplification circuitry 411 includes an input transmit amplifier 435, a splitter 346, a first output transmit amplifier 437, and a second output transmit amplifier 438. The transmit amplification circuitry 411 operates to generate a pair of amplified transmit signals that are separately processed before being combined by the combiner 431 and provided to an antenna. In particular, a first output of the transmit amplification circuitry 411 provides a first amplified transmit signal to a first terminal of the first combiner 431 by way of the first antenna-side circulator 402 and the first 90° phase shifter 421, while a second output of the transmit amplification circuitry 411 provides a second amplified transmit signal to a second terminal of the first combiner 431 by way of the second 90° phase shifter 422 and the second antenna-side circulator 403.

Additionally, the second combiner 432 serves to combine the output of the second antenna-side circulator 403 after phase shifting by the third 90° phase shifter 423 with the output of the first antenna-side circulator 402. The combined signal is then provided to an input of the receive amplifier 415.

By implementing the communication system 440 in this manner cancellation of TxLkg and RxBN is provided, while coherent summation is provided for transmit-to-antenna (Tx-to-Ant) and antenna-to-receive (Ant-to-Rx) signals.

Figure 12:
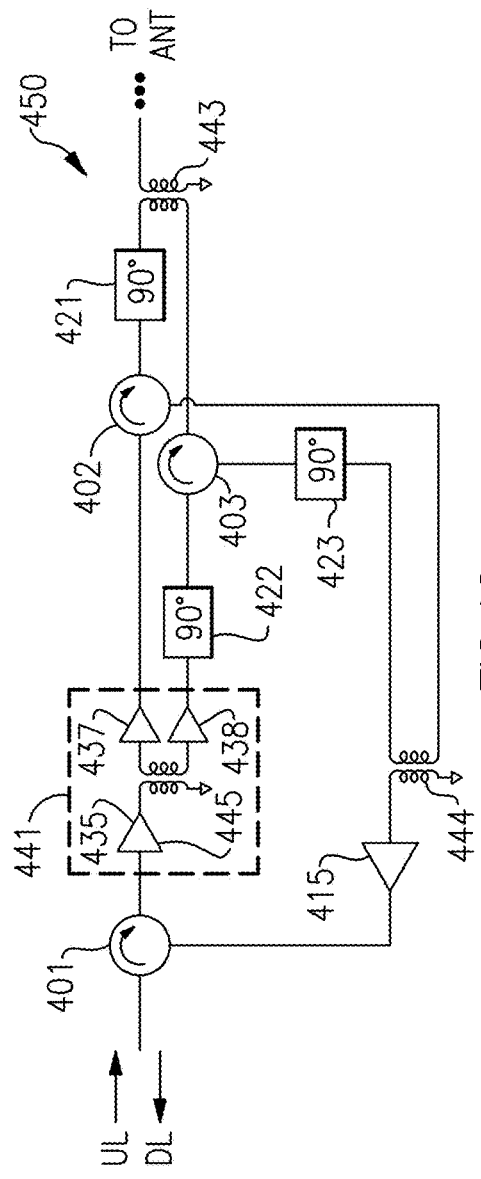
FIG. 12 is a schematic diagram of another embodiment of a communication system with remote compensation.

FIG. 12 is a schematic diagram of another embodiment of a communication system 450 with remote compensation. The communication system 450 includes a cable-side circulator 401, a first antenna-side circulator 402, a second antenna-side circulator 403, transmit push-pull amplifier 441, a receive amplifier 415, a first 90° phase shifter 421, a second 90° phase shifter 422, a third 90° phase shifter 423, a first balun 443, and a second balun 444.

The communication system 450 of FIG. 12 provides cancellation of TxLkg and RxBN, while coherent summation is provided for transmit-to-antenna (Tx-to-Ant) and antenna-to-receive (Ant-to-Rx) signals. In contrast to the communication system 450 of FIG. 11 which operates with single-ended transmit, the communication system 450 of FIG. 12 operates with differential transmit.

Figure 13:
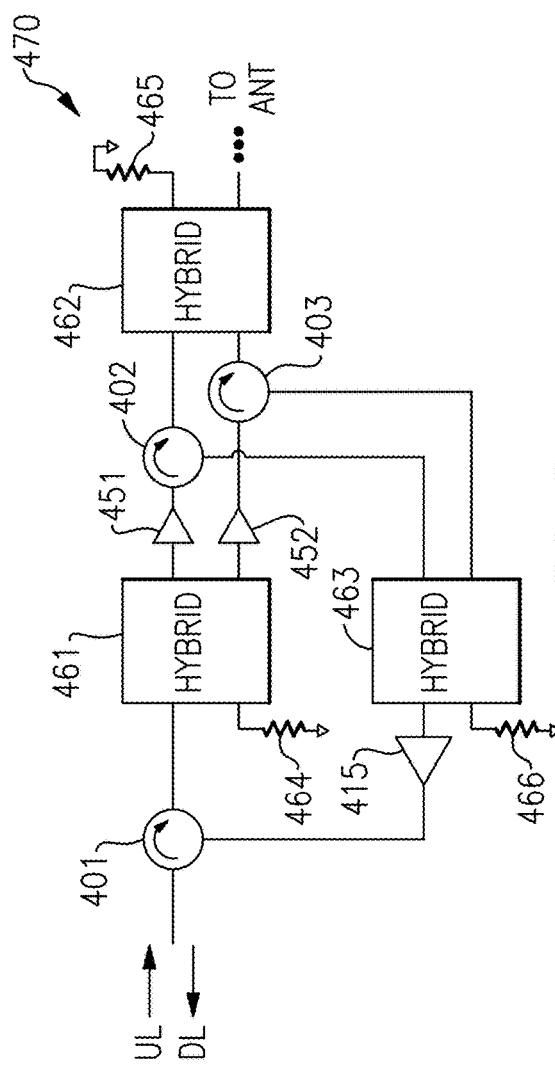
FIG. 13 is a schematic diagram of another embodiment of a communication system with remote compensation.

FIG. 13 is a schematic diagram of another embodiment of a communication system 470 with remote compensation. The communication system 470 includes a cable-side circulator 401, a first antenna-side circulator 402, a second antenna-side circulator 403, a first transmit amplifier 451, a second transmit amplifier 452, a receive amplifier 415, a first 90° hybrid 461, a second 90° hybrid 462, a third 90° hybrid 463, a first termination resistor 464, a second termination resistor 465, and a third termination resistor 466.

The first 90° hybrid 461 operates to process a transmit signal to generate a pair of quadrature transmit signals (separated by about 90° in phase) that are provided to the first transmit amplifier 451 and the second transmit amplifier 452 for amplification. The pair of quadrature transmits signals are provided to the first antenna-side circulator 402 and the second antenna-side circulator 403, respectively, which include antenna terminals coupled to the second 90° hybrid 462 and receive terminals coupled to the third 90° hybrid 463. The third 90° hybrid 463 provides an input signal to the receive amplifier 415.

By implementing the communication system 470 in this manner cancellation of TxLkg and RxBN is provided, while coherent summation is provided for transmit-to-antenna (Tx-to-Ant) and antenna-to-receive (Ant-to-Rx) signals.

Figure 14:
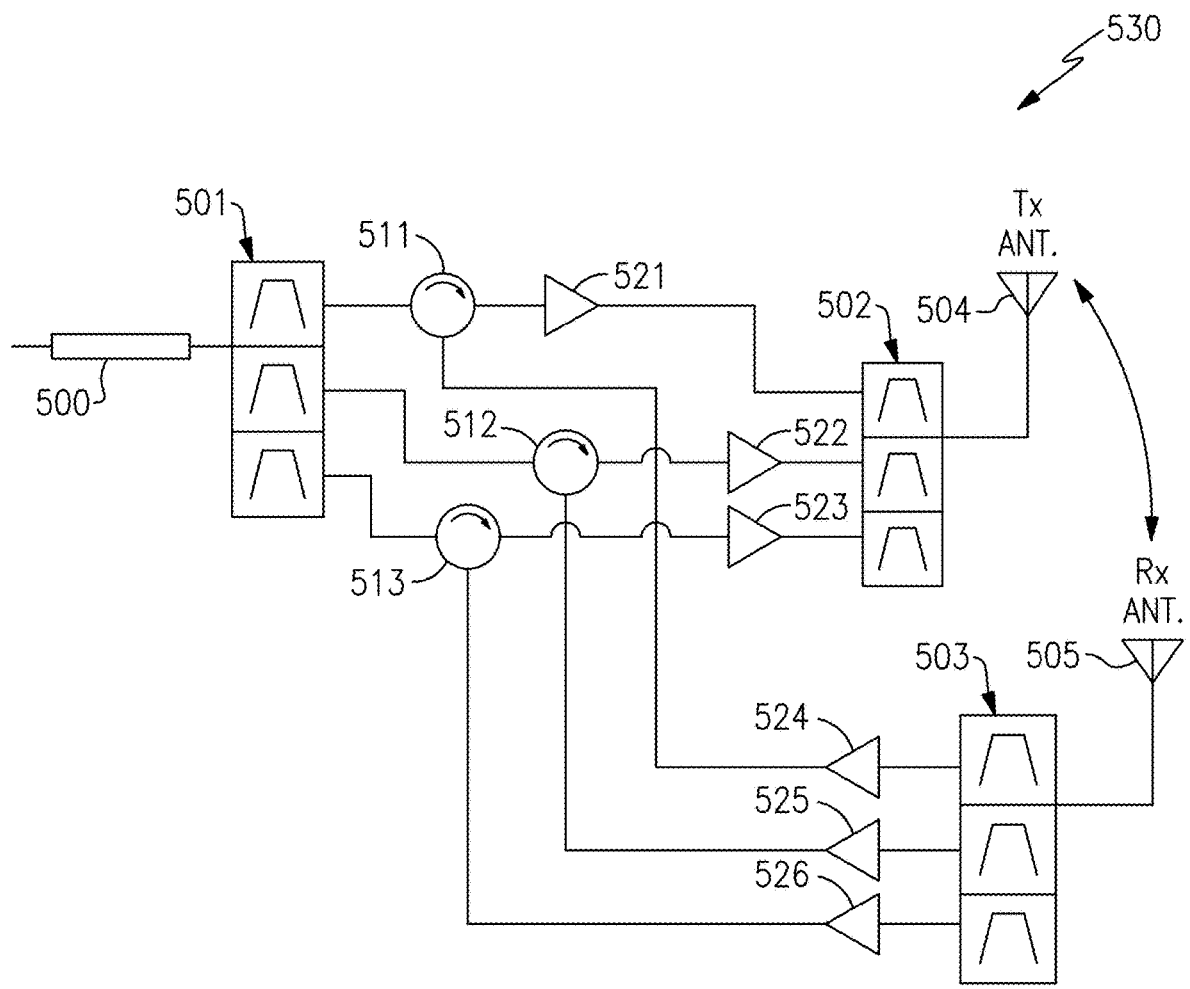
FIG. 14 is a schematic diagram of another embodiment of a communication system with remote compensation.

FIG. 14 is a schematic diagram of another embodiment of a communication system 530 with remote compensation. The communication system 530 includes a cable 500, a cable-side multiplexer 501, a transmit antenna-side multiplexer 502, a receive antenna-side multiplexer 503, a first cable-side circulator 511, a second cable-side circulator 512, a third cable-side circulator 513, a first transmit amplifier 521, a second transmit amplifier 522, a third transmit amplifier 523, a first receive amplifier 524, a second receive amplifier 525, and a third receive amplifier 526.

In the illustrated embodiment, the transmit amplifiers 521-523 (for instance, power amplifiers) generate transmit signals for transmission on the transmit antenna 504, while the receive amplifiers 524-526 provide amplification to receives signals from the receive antenna 505. Implementing the communication system 530 in this manner enables broadband isolation between transmit and receive paths (for both leakage of the high power transmit carrier as well as the in-channel received band noise that falls directly into the desired receive channel).

Moreover, the communication system 530 supports concurrency for FDD and TDD by including the circulators 511-513 at the inputs of the transmit amplifiers 521-523, respectively, and by including the depicted multiplexers 501-503.

Furthermore, using separate transmit and receive antennas reduces transmit leakage and receive band noise to thereby reduce or eliminate problems associated with receive desense.

The circulators 511-513 also enable an important signal merge of the transmit and receive paths without expensive and complex filtering requirements, and operate using a shared feed cable 500 to connect to a main RFFE.

Figure 15A:
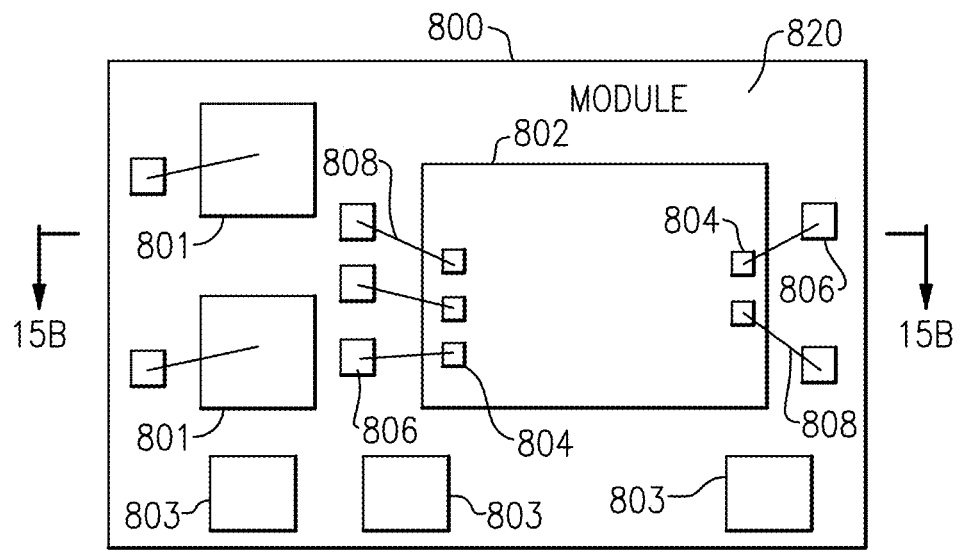
FIG. 15A is a schematic diagram of one embodiment of a packaged module.
Figure 15B:
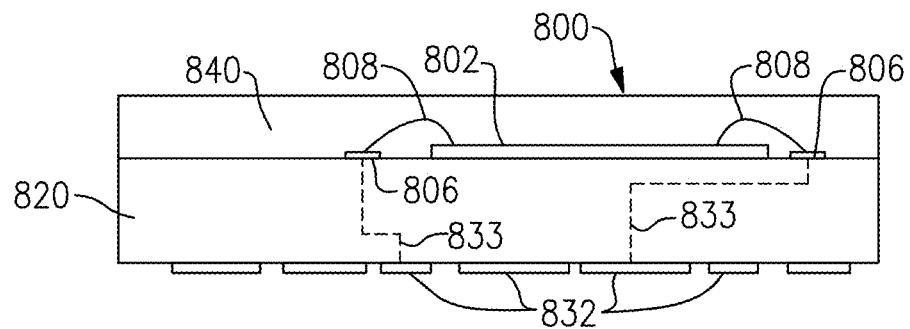
FIG. 15B is a schematic diagram of a cross-section of the packaged module of FIG. 15A taken along the lines 15B-15B.

FIG. 15A is a schematic diagram of one embodiment of a packaged module 800. FIG. 15B is a schematic diagram of a cross-section of the packaged module 800 of FIG. 15A taken along the lines 15B-15B. The packaged module 800 can include a remote compensator implemented in accordance with any of the embodiments disclosed herein.

The packaged module 800 includes radio frequency components 801, a semiconductor die 802, surface mount devices 803, wirebonds 808, a package substrate 820, and an encapsulation structure 840. The package substrate 820 includes pads 806 formed from conductors disposed therein. Additionally, the semiconductor die 802 includes pins or pads 804, and the wirebonds 808 have been used to connect the pads 804 of the die 802 to the pads 806 of the package substrate 820.

The packaged module 800 can be implemented in accordance with one or more features disclosed herein. For example, a remote compensator in accordance with the teachings herein can be implemented on packaged module. In one example, amplifiers of the remote compensator are fabricated on the semiconductor die 802, while circulators and multiplexers of the remote compensator are implemented as a components attached to the substrate 820.

The packaging substrate 820 can be configured to receive a plurality of components such as radio frequency components 801, the semiconductor die 802 and the surface mount devices 803, which can include, for example, surface mount capacitors and/or inductors. In one implementation, the radio frequency components 801 include integrated passive devices (IPDs).

As shown in FIG. 15B, the packaged module 800 is shown to include a plurality of contact pads 832 disposed on the side of the packaged module 800 opposite the side used to mount the semiconductor die 802. Configuring the packaged module 800 in this manner can aid in connecting the packaged module 800 to a circuit board, such as a phone board of a mobile device. The example contact pads 832 can be configured to provide radio frequency signals, bias signals, and/or power (for example, a power supply voltage and ground) to the semiconductor die 802 and/or other components. As shown in FIG. 15B, the electrical connections between the contact pads 832 and the semiconductor die 802 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 16:
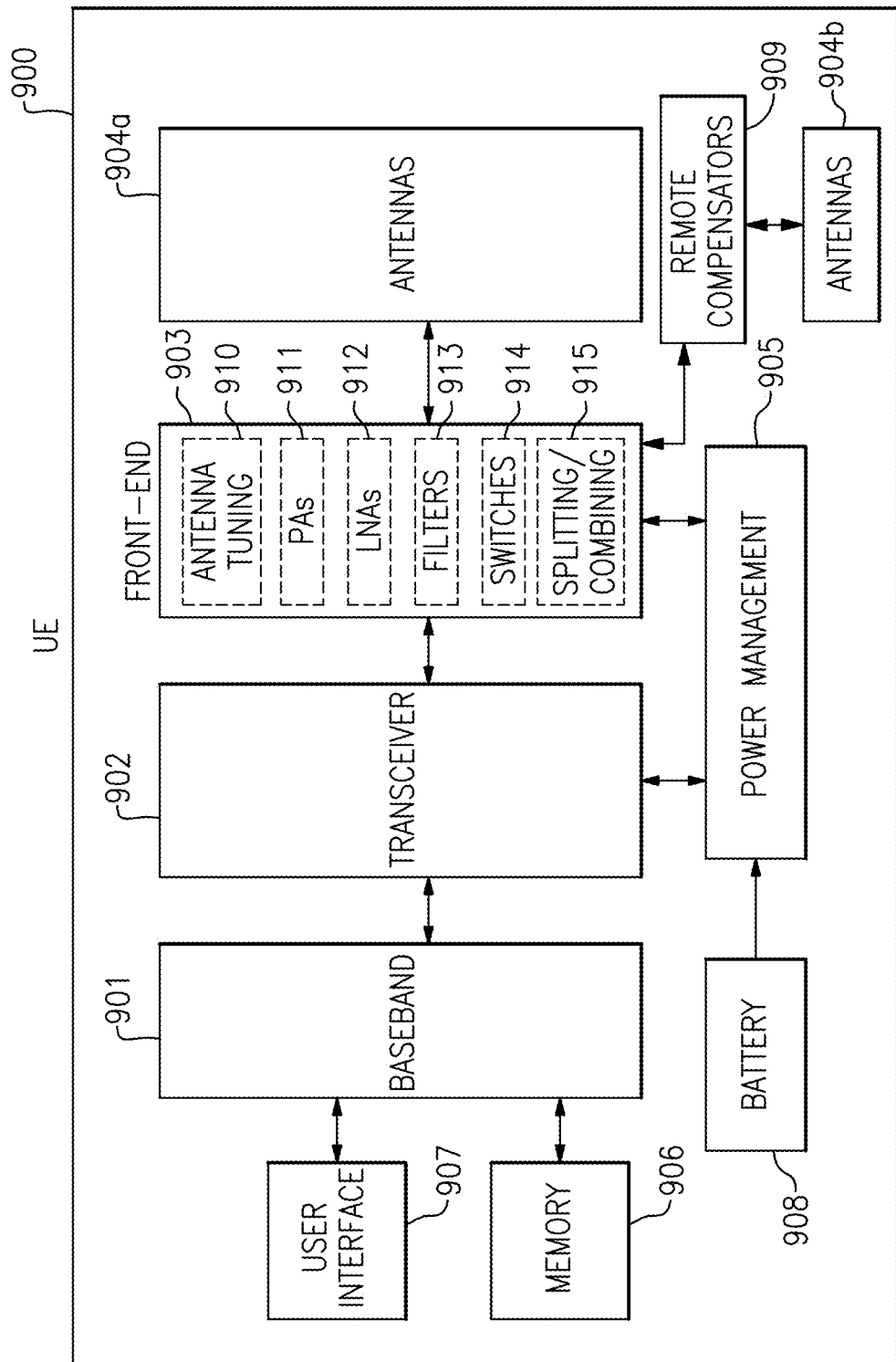
FIG. 16 is a schematic diagram of one embodiment of a mobile device.

FIG. 16 is a schematic diagram of one embodiment of a mobile device 900. The mobile device 900 includes a baseband system 901, a transceiver 902, a front-end system 903, a first group of antennas 904a, a second group of antennas 904b, a power management system 905, a memory 906, a user interface 907, a battery 908, and remote compensators 909.

As shown in FIG. 16, the remote compensators 909 are positioned between the front-end system 910 and the second group of antennas 904b, and operate to provide signal compensation. The remote compensators 909 can be implemented in accordance with any of the embodiments herein.

The mobile device 900 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 902 generates RF signals for transmission and processes incoming RF signals received from the antennas 904a/904b. It will be understood that various functionalities associated with the transmission and receiving of RF signals can be achieved by one or more components that are collectively represented in FIG. 16 as the transceiver 902. In one example, separate components (for instance, separate circuits or dies) can be provided for handling certain types of RF signals.

The front-end system 903 aids is conditioning signals transmitted to and/or received from the antennas 904a/904b. In the illustrated embodiment, the front-end system 903 includes antenna tuning circuitry 910, power amplifiers (PAs) 911, low noise amplifiers (LNAs) 912, filters 913, switches 914, and signal splitting/combining circuitry 915. However, other implementations are possible.

For example, the front-end system 903 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 900 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 904a-904b can include antennas used for a wide variety of types of communications. For example, the first group of antennas 904a and/or the second group of antennas 904b can include antennas for transmitting and/or receiving signals associated with a wide variety of frequencies and communications standards.

In certain implementations, the first group of antennas 904a and/or the second group of antennas 904b support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 900 can operate with beamforming in certain implementations. For example, the front-end system 903 can include amplifiers having controllable gain and phase shifters having controllable phase to provide beam formation and directivity for transmission and/or reception of signals using the first group of antennas 904a and/or the second group of antennas 904b. For example, in the context of signal transmission, the amplitude and phases of the transmit signals provided to the first group of antennas 904a and/or the second group of antennas 904b are controlled such that radiated signals from the first group of antennas 904a and/or the second group of antennas 904b combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the first group of antennas 904a and/or the second group of antennas 904b from a particular direction. In certain implementations, the first group of antennas 904a and/or the second group of antennas 904b include one or more arrays of antenna elements to enhance beamforming.

The baseband system 901 is coupled to the user interface 907 to facilitate processing of various user input and output (I/O), such as voice and data. The baseband system 901 provides the transceiver 902 with digital representations of transmit signals, which the transceiver 902 processes to generate RF signals for transmission. The baseband system 901 also processes digital representations of received signals provided by the transceiver 902. As shown in FIG. 16, the baseband system 901 is coupled to the memory 906 of facilitate operation of the mobile device 900.

The memory 906 can be used for a wide variety of purposes, such as storing data and/or instructions to facilitate the operation of the mobile device 900 and/or to provide storage of user information.

The power management system 905 provides a number of power management functions of the mobile device 900. In certain implementations, the power management system 905 includes a PA supply control circuit that controls the supply voltages of the power amplifiers 911. For example, the power management system 905 can be configured to change the supply voltage(s) provided to one or more of the power amplifiers 911 to improve efficiency, such as power added efficiency (PAE).

As shown in FIG. 16, the power management system 905 receives a battery voltage from the battery 908. The battery 908 can be any suitable battery for use in the mobile device 900, including, for example, a lithium-ion battery.

Applications

The principles and advantages of the embodiments described herein can be used for a wide variety of applications.

For example, remote compensators can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a cable-side circulator including an output configured to provide a transmit signal and an input configured to receive an amplified receive signal;
an antenna;
receive amplifier circuitry configured to amplify a receive signal from the antenna and to provide the amplified receive signal to the cable-side circulator;
transmit amplifier circuitry including a power amplifier configured to amplify the transmit signal from the cable-side circulator; and
a first antenna-side circulator and a second antenna-side circulator connected in series with the power amplifier between the output of the cable-side circulator and the antenna, the first antenna-side circulator and the second antenna-side circulator configured to control the input of the cable-side circulator to compensate the amplified receive signal for transmit leakage arising from the transmit amplifier circuitry.

2. The mobile device of claim 1 wherein the transmit amplifier circuitry includes an input connected to the cable-side circulator and an output connected to the second antenna-side circulator, the first antenna-side circulator connected between the second antenna-side circulator and the antenna.

3. The mobile device of claim 2 further comprising a combiner configured to generate the receive signal at an output and coupled to the first antenna-side circulator at a first input, and a phase shifter coupled between the second antenna-side circulator and a second input of the combiner.

4. The mobile device of claim 1 further comprising a front-end system and a cable connecting the front-end system to the cable-side circulator, the cable configured to carry the transmit signal and the amplified receive signal.

5. A remote compensator for a mobile device, the remote compensator comprising:
a cable-side circulator coupled to a cable port, the cable-side circulator including an output configured to provide a transmit signal and an input configured to receive an amplified receive signal;
receive amplifier circuitry configured to amplify a receive signal from an antenna port to provide the amplified receive signal to the cable-side circulator;
transmit amplifier circuitry including a power amplifier configured to amplify the transmit signal from the cable-side circulator; and
a first antenna-side circulator and a second antenna-side circulator connected in series with the power amplifier between the output of the cable-side circulator and the antenna port, the first antenna-side circulator and the second antenna-side circulator configured to control the input of the cable-side circulator to compensate the amplified receive signal for transmit leakage arising from the transmit amplifier circuitry.

6. The remote compensator of claim 5 wherein the transmit amplifier circuitry includes an input connected to the cable-side circulator and an output connected to the second antenna-side circulator, the first antenna-side circulator connected between the second antenna-side circulator and the antenna port.

7. A method of remote compensation in a mobile device, the method comprising:
amplifying a receive signal from an antenna to generate an amplified receive signal using receive amplifier circuitry;
providing the amplified received signal from the receive amplifier circuitry to a cable by way of an input of a cable-side circulator;
amplifying a transmit signal from an output of the cable-side circulator using transmit amplifier circuitry including a power amplifier; and
compensating the receive signal for transmit leakage arising from the transmit amplifier circuitry using a first antenna-side circulator and a second antenna-side circulator connected in series with the power amplifier between the output of the cable-side circulator and the antenna, including controlling the input of the cable-side circulator using the first antenna-side circulator and the second antenna-side circulator.

8. The method of claim 7 wherein the second antenna-side circulator includes an input connected to an output of the power amplifier, a first output connected to an input of the first antenna-side circulator, and a second output connected to an input of a phase shifter, the method further comprising generating a phase-shifted radio frequency signal by phase shifting a first radio frequency signal from the second output of the second antenna-side circulator.

9. The method of claim 8 further comprising combining the phase-shifted radio frequency signal and a second radio frequency signal from an output of the first antenna-side circulator using a combiner.

10. The method of claim 9 further comprising providing a 180 degree phase shift using the phase shifter.

11. The mobile device of claim 1 further comprising an antennas-side multiplexer connected between the antenna and the first antenna-side circulator.

12. The mobile device of claim 1 wherein the second antenna-side circulator is directly connected between the first antenna-side circulator and an output of the power amplifier.

13. The mobile device of claim 1 further comprising a phase shifter, the second antenna-side circulator including an input connected to an output of the power amplifier, a first output connected to an input of the first antenna-side circulator, and a second output connected to an input of the phase shifter.

14. The mobile device of claim 13 wherein the first antenna-side circulator further includes a first output connected to the antenna.

15. The mobile device of claim 14 further comprising a combiner including a first input connected to an output of the phase shifter, a second input connected to a second output of the first antenna-side circulator, and an output connected to an input of the receive amplifier circuitry.

16. The mobile device of claim 15 wherein the phase shifter provides a 180 degree phase shift.

17. The remote compensator of claim 5 wherein the second antenna-side circulator is directly connected between the first antenna-side circulator and an output of the power amplifier.

18. The remote compensator of claim 5 further comprising a phase shifter, the second antenna-side circulator including an input connected to an output of the power amplifier, a first output connected to an input of the first antenna-side circulator, and a second output connected to an input of the phase shifter.

19. The remote compensator of claim 18 wherein the first antenna-side circulator further includes a first output connected to the antenna port.

20. The remote compensator of claim 5 further comprising a combiner including a first input connected to an output of the phase shifter, a second input connected to a second output of the first antenna-side circulator, and an output connected to an input of the receive amplifier circuitry.

* * * * *